(12) United States Patent
Jae Kap

(10) Patent No.: US 6,297,986 B1
(45) Date of Patent: Oct. 2, 2001

(54) FERROELECTRIC RANDOM ACCESS MEMORY

(75) Inventor: Kim Jae Kap, Kyoungki-do (KR)

(73) Assignee: Dongbu Electronics, Co, Ltd., Seoul (KR)

( * ) Notice: Subject to any disclaimer, the term of this patent is extended or adjusted under 35 U.S.C. 154(b) by 0 days.

(21) Appl. No.: 09/672,718

(22) Filed: Sep. 28, 2000

(30) Foreign Application Priority Data

Sep. 30, 1999 (KR) .................................................. 99-42044

(51) Int. Cl.[7] .................................................. G11C 11/22
(52) U.S. Cl. ................ 365/145; 365/230.03; 365/189.07
(58) Field of Search .............................. 365/145, 189.07, 365/230.03, 189.01, 230.01, 129

(56) References Cited

U.S. PATENT DOCUMENTS

| | | |
|---|---|---|
| 4,873,664 | 10/1989 | Faton Jr. . |
| 5,297,077 | * 3/1994 | Imai et al. ............................ 365/145 |
| 5,414,654 | 5/1995 | Kubota et al. . |
| 5,487,032 | 1/1996 | Mihara et al. . |
| 5,517,445 | * 5/1996 | Imai et al. ............................ 365/145 |
| 5,574,679 | * 11/1996 | Ohtsuki et al. ....................... 365/145 |
| 5,926,413 | 7/1999 | Yamada et al. . |
| 5,969,981 | 10/1999 | Kono et al. . |
| 6,111,777 | 8/2000 | Ogiwara et al. . |

\* cited by examiner

*Primary Examiner*—Hoai V. Ho
(74) *Attorney, Agent, or Firm*—Timothy J. Keefer; Wildman, Harrold, Allen & Dixon

(57) ABSTRACT

Disclosed is a ferroelectric random access memory including a plurality of bit lines extending in one direction, a plurality of plate electrode lines extending in another direction perpendicular to the one direction, a plurality of word lines extending in the same direction as the plate electrode lines, and a plurality of unit cells arranged in an M×N array. The unit cells are grouped into a plurality of unit cell groups, each unit cell group consists of a plurality of unit cells connected to associated bit lines such that the unit cells are interlaced in a row direction or in a column direction. A dummy cell group consists of a plurality of dummy cells each connected to an associated one of the bit lines at an optional position on the associated bit line. A switching transistor group consists of a plurality of switching transistors each serving to switch a connection between associated ones of the unit cells on an associated one of the bit lines, and to switch an input-to-input/output-to-output coupling between two associated dummy cells, in response to a control signal externally applied. When data is read from an optional one of the unit cells on a selected one of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

31 Claims, 12 Drawing Sheets

FERROELECTRIC RANDOM ACCESS MEMORY

CROSS REFERENCE TO RELATED APPLICATION

This application claims the priority of Korean patent application Ser. No. 99-42044 filed on Sep. 30, 1999.

BACKGROUND OF THE INVENTION

1. Field of the Invention

The present invention relates to a ferroelectric memory device, and more particularly to a ferroelectric random access memory device fabricated using a ferroelectric material having a perovskite structure to obtain an enhanced reliability when data is read out.

2. Description of the Related Art

As well known, semiconductor memory devices are classified into volatile memory devices and non-volatile memory devices in accordance with whether or not information is lost when power is off. A dynamic random access memory (DRAM), which is a volatile memory, is configured to keep information only in a power-on state even though it has a high operating speed. Such a DRAM also has a drawback in that the consumption of power is excessive because refreshing of data should be carried out at intervals of a certain time in order to prevent data from being lost due to leakage current from a charge transfer transistor coupled to a capacitor. Meanwhile, EEPROMs and flash memories, which are non-volatile memories, have drawbacks of a low operating speed and an excessive power consumption even though data can kept in a power-off state.

On the other hand, a ferroelectric random access memory (FeRAM) has advantages in that they have an operating speed similar to that of DRAMs while exhibiting a reduced power consumption. Such an FeRAM is a non-volatile memory capable of keeping data even in a power-off state, like EEPROMs and flash memories. By virtue of these advantages, such an FeRAM has recently been recognized as a substitutive memory for DRAMs, EEPROMs, flash memories, and other semiconductor memories. In accordance with such a recognition, active research and development have been made for FeRAMs in many companies and research institutes in the world.

Such an FeRAM uses a capacitor made of a ferroelectric film, such as $PZT(Pb(Zr,Ti)O_3$ or $SBT(SrBi_2Ta_2O_9)$, having spontaneous polarization characteristics capable of maintaining a polarization generated in accordance with an application of a certain voltage, even after power is off. Such an FeRAM utilizes the hysteretic characteristic of a ferroelectric depicted in FIG. 1.

Referring to FIG. 1, the ferroelectric is polarized when a voltage V applied to the ferroelectric is increased in a plus (+) direction, so that it exhibits a maximum polarized value Qmax at a maximum voltage. When the applied voltage is cut off, the residual polarization of the ferroelectric corresponds to "Qr". This residual polarization value Qr corresponds to data "1". When the voltage V is decreased in a minus (−) direction, the ferroelectric is polarized in an opposite direction, so that it exhibits a minimum polarized value Qmin at a minimum voltage. When the applied voltage is cut off in this state, the residual polarization of the ferroelectric corresponds to "−Qr". This residual polarization value −Qr corresponds to data "0".

Here, the "+" and "−" directions of the voltage V are indicative of different relative potential relations between the upper and lower electrodes of the capacitor, respectively. The "+" direction means that the upper electrode has a potential relatively higher than that of the lower electrode. The "−" direction means that the upper electrode has a potential relatively lower than that of the lower electrode.

This will be described in more detail, in conjunction with FIG. 5 which is a circuit diagram illustrating the equivalent circuit of a conventional FeRAM. In order to store data "1" in a capacitor of a unit cell UC in the circuit of FIG. 5, a potential, which is higher than that applied to a plate electrode, is applied to a bit line in an ON state of a charge transfer transistor, thereby causing a ferroelectric to be spontaneously polarized. After the spontaneous polarization of the ferroelectric, the charge transfer transistor is turned off, so that data "1" is stored. On the other hand, data "0" is stored by applying, to the bit line, a potential lower than the potential applied to the plate electrode in the ON state of the charge transfer transistor, thereby spontaneously polarizing the ferroelectric, and then turning off the charge transfer transistor.

When data stored in the capacitor is to be read out from the memory, the charge transfer transistor is turned off in a state in which a potential higher than that applied to the plate electrode is applied to the bit line. As a result, a charge dQ1 is discharged into the bit line when the data stored in the capacitor is "1". When the data stored in the capacitor is "0", a charge dQ0 is discharged into the bit line. That is, the potential of the bit line varies in accordance with the value of the data stored in the capacitor because the charge discharged into the bit line varies in accordance with the value of the stored data.

When the data stored in the capacitor is "1", the potential variation V1 of the bit line corresponds to "dQ1/(Cb+Cs)" (V1=dQ1/(Cb+Cs)). On the other hand, the data stored in the capacitor is "0", the potential variation V0 of the bit line corresponds to "dQ0/(Cb+Cs)" (V0=dQ0/(Cb+Cs)). Therefore, it is possible to determine the data ("1" or "0") by comparing the potential of the bit line, outputted at an output terminal (not shown) of the memory, with a reference potential.

The conventional FeRAM shown in FIG. 5 consists of unit cells UC each having a 1T/1C structure including one transistor and one capacitor.

Referring to FIG. 5, the FeRAM includes M×N unit cells. Each unit cell UC consists of one transistor (a charge transfer transistor), and one capacitor. The transistor of each unit cell UC is coupled at a gate thereof to an associated one of word lines WL0, WL1, and WL2, at a drain (or a source) thereof to an associated one of bit lines BL0 and BL1, and at a source (a drain) thereof to one end of the capacitor included in the unit cell DC. The other end of the capacitor is connected to an associated one of plate electrode lines PL0, PL1, and PL2. Each bit line BL0 or BL1 is coupled at one end thereof to an associated one of comparators C0 and C1.

The above mentioned conventional FeRAM also includes a reference voltage generating circuit. This reference voltage generating circuit includes two switching transistors ST0 and ST1, and two dummy cells DC0 and DC1. Each of the dummy cells DC0 and DC1 consists of one transistor (a charge transfer transistor), and one capacitor. Respective transistors of the dummy cells DC0 and DC1 are coupled at their drains (or sources) to dummy bit lines DBL and /DBL, and coupled to each other via switching transistors ST0 and ST1 respectively connected to the dummy bit lines DBL and /DBL, thereby forming a common output. The common output from the switching transistors ST0 and ST1 is coupled to the other input of each of the comparators C0 and C1.

That is, each of the comparators C0 and C1 is coupled at one input thereof to an associated one of the bit lines BL0 and BL1, and at the other input thereof to the common output of the dummy bit lines DBL and /DBL. Accordingly, each comparator C0 or C1 determines data ("0" or "1") outputted from an optional unit cell UC by comparing the voltage of the unit cell UC, applied thereto via the associated bit line, with a reference voltage applied thereto from the common output of the switching transistors ST0 and ST1.

Although the conventional FeRAM having the 1T/1C structure has an advantage in terms of a high integration in that it has a small unit cell size, there is a problem in that there may be a RC delay and a drop of the reference voltage because the data determination is carried out by comparing the potential of each bit line with the reference voltage transmitted from the reference voltage generating circuit via an interconnection line having a length different from that of the bit line. Such a problem is a main factor causing errors in the determination of output data.

FIG. 6 is an equivalent circuit diagram illustrating a part of a conventional FeRAM having a 2T/2C structure consisting of two transistors and two capacitors.

The FeRAM shown in FIG. 6 configures each unit cell UC by two transistors (charge transfer transistors) and two capacitors in such a fashion that a reference voltage to be compared with the potential of a bit line adjacent to the unit cell UC is generated from the unit cell UC, as compared to the FeRAM of FIG. 5 including a separate reference voltage generating circuit.

Since each unit cell UC generates a reference voltage to be compared with the potential of a bit line adjacent thereto, the FeRAM having the 2T/2C structure can eliminate the problems involved in the FeRAM having the 1T/1C structure, that is, an RC delayer and a drop of the reference voltage.

However, the FeRAM having the 2T/2C structure has an increased unit cell size because two charge transfer transistors are formed for each unit cell. As a result, this FeRAM has a fatal problem in that it is impossible to achieve a high integration.

SUMMARY OF THE INVENTION

A first object of the invention is to provide an FeRAM capable of enhancing the reliability in the determination of data read out, and easily achieving a high integration.

A second object of the invention is to provide an FeRAM capable of achieving a reliable data determination and a high integration while obtaining an increase in capacitance.

In accordance with one aspect, the present invention provides a ferroelectric random access memory comprising a plurality of bit lines extending in one direction, a plurality of plate electrode lines extending in another direction perpendicular to the one direction, a plurality of word lines extending in the same direction as the plate electrode lines, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; further comprising: a dummy cell group consisting of a plurality of dummy cells each connected to an associated one of the bit lines at an optional position on the associated bit line, each of the dummy cells consisting of one transistor and one capacitor; and a switching transistor group consisting of a plurality of switching transistors each serving to switch a connection between associated ones of the unit cells on an associated one of the bit lines, and to switch an input-to-input/output-to-output coupling between two associated ones of the dummy cells, in response to a control signal externally applied thereto; whereby when data is read out from an optional one of the unit cells on a selected one of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

In accordance with another aspect, the present invention provides a ferroelectric random access memory comprising a plurality of bit lines extending in one direction, a plurality of word lines in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; further comprising: a dummy cell group consisting of a plurality of dummy cells each connected to an associated one of the bit lines at an optional position on the associated bit line, each of the dummy cells consisting of one transistor and one capacitor; a switching transistor group consisting of a plurality of switching transistors each serving to switch a connection between associated ones of the unit cells on an associated one of the bit lines, and to switch an input-to-input/output-to-output coupling between two associated ones of the dummy cells, in response to a control signal externally applied thereto; a common plate electrode line, to which respective plate electrodes of the unit cells and respective plate electrodes of the dummy cells are connected in common, the common plate electrode line being applied with a predetermined voltage; whereby when data is read out from an optional one of the unit cells on a selected one of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

In accordance with another aspect, the present invention provides a ferroelectric random access memory comprising a plurality of bit lines extending in one direction, a plurality of word lines in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series; further comprising: a dummy cell group consisting of a plurality of dummy cells each connected to an associated one of the bit lines at an optional position on the associated bit line, each of the dummy cell consisting of one transistor and one capacitor; a switching transistor group consisting of a plurality of switching transistors each serving to switch an input-to-input/output-to-output coupling between respective dummy cells connected to two of the bit lines neighboring to each other in an interlaced fashion, the switching transistor applying an output thereof to a selected one of the two neighboring bit lines in response to a control signal externally applied thereto; a common plate electrode line, to which respective plate electrodes of the unit cells and respective plate electrodes of the dummy cells are connected in common, the common plate electrode line being applied with a predetermined voltage; whereby when data is read out from an optional one of the unit cells on a selected one of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

The important technical idea of the present invention is to provide an FeRAM according to this embodiment, which consists of M×N unit cells, each unit cell having a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In accordance with such technical means, data read out from an optional unit cell is determined by comparing a voltage outputted from a bit line, on which the data from that unit cell is read out, with a reference voltage outputted from bit lines neighboring to that bit line while having a potential inverse to the potential of the bit line. Accordingly, it is possible to greatly enhance the reliability in the determination of data read out from the unit cells of the memory while achieving a high integration of the memory. Thus, the first object of the present invention can be easily accomplished by virtue of the above mentioned technical means.

Alternatively, another technical means may be used, in which a single plate electrode is used in common for memory cells, in place of plate electrode lines separated from one another in a row or column direction. By virtue of such technical means, the second object of the present invention to achieve an increase in capacitance within a given area can be accomplished.

Alternatively, the FeRAM may use a configuration in which dummy data is stored and read out only using switching transistors each adapted to two bit lines neighboring to each other in an interlaced fashion. In this case, it is possible to more simplify the memory arrangement.

Now, preferred embodiments of the present invention will be described in detail, in conjunction with the annexed drawings.

[First Embodiment]

Figure 1:
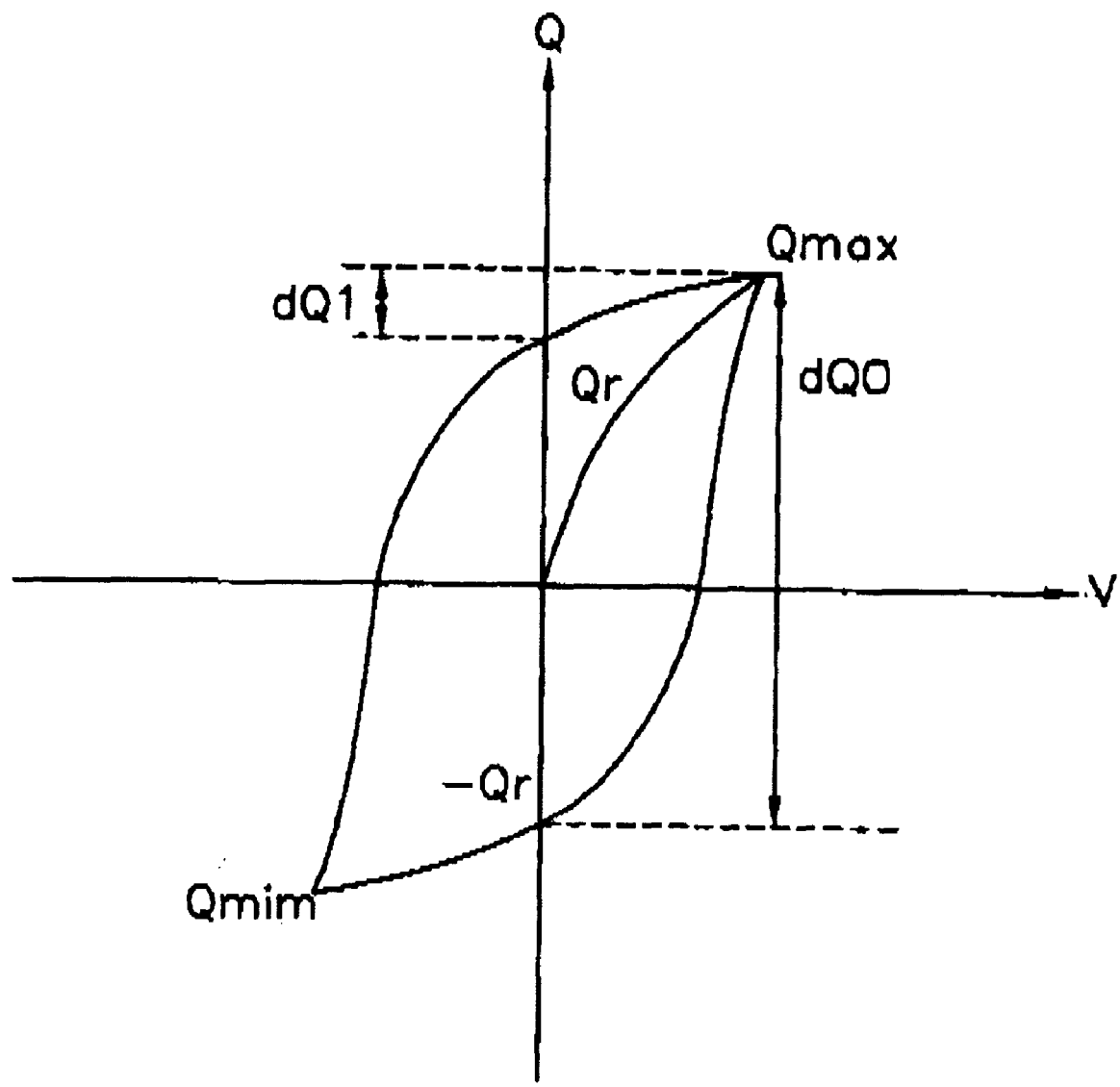
FIG. 1 is a hysteretic characteristic diagram illustrating polarization characteristics of a ferroelectric film.
Figure 2A:
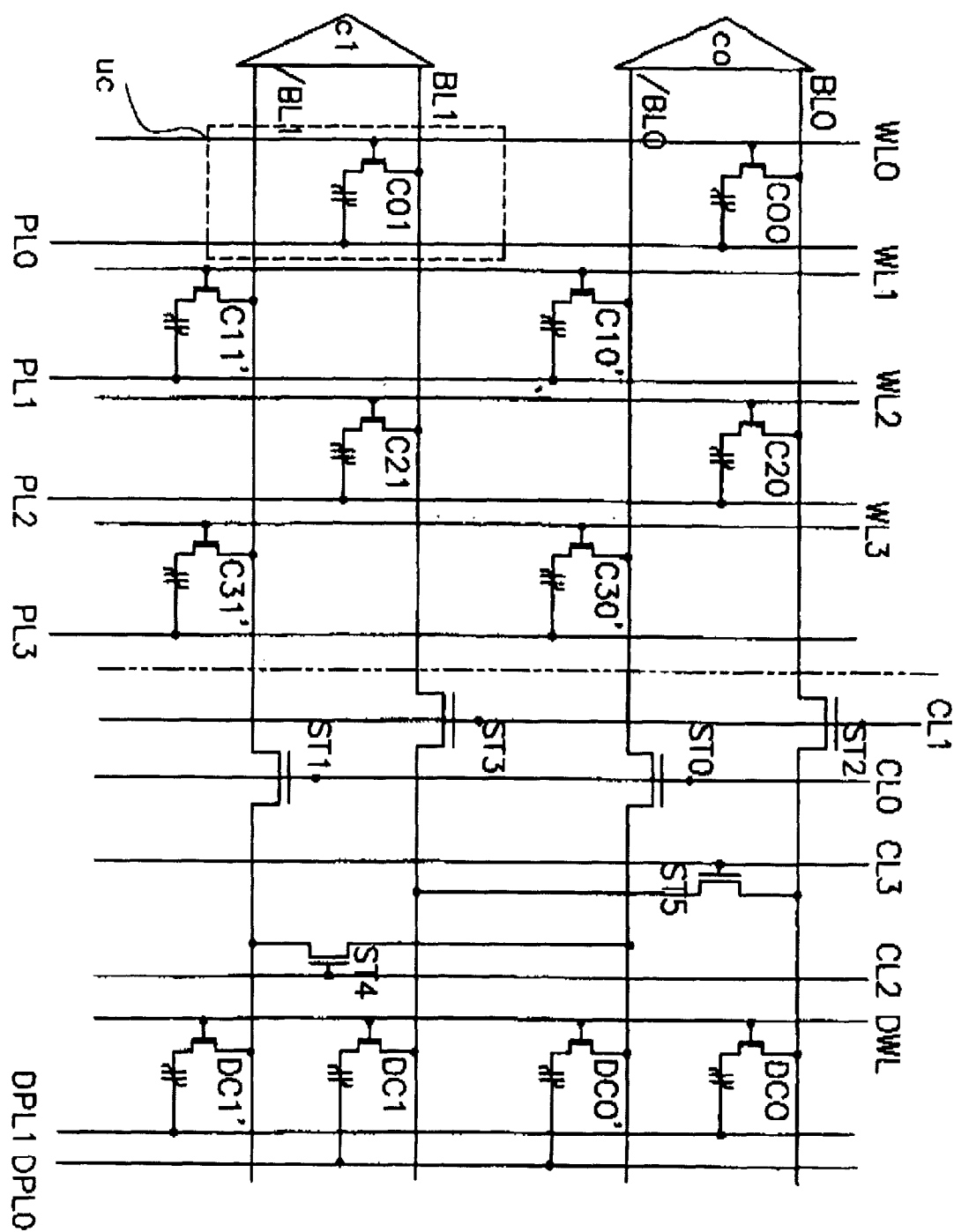
FIG. 2a is an equivalent circuit diagram illustrating a part of an FeRAM in accordance with a first embodiment of the present invention.

FIG. 2a is an equivalent circuit diagram illustrating a part of an FeRAM in accordance with a first embodiment of the present invention.

Referring to FIG. 2a, the FeRAM according to this embodiment includes M×N unit cells arranged in rows and columns in an interlaced fashion, like the black or white pattern of a chess plate. A plurality of unit cells arranged in the same row are connected together in series by one of bit lines arranged in pair. The bit lines of each bit line pair operate alternatingly in such a fashion that when data is read out on one bit line, the other bit line serves as an inverted bit line providing a reference voltage.

The FeRAM according to this embodiment extends in a row direction in such a fashion that a plurality of unit cells are arranged in an M×N matrix array in which a plurality of word lines WL0 to WL3 and a plurality of plate electrode lines PL0 to PL3 each connected to a plurality of unit cells arranged in the same column cross a plurality of bit lines arranged in pair. Each bit line pair consists of one bit line and one inverted bit line. In FIG. 2a, "BL0" and "/BL0" denote the bit lines of one bit line pair, and "BL1" and "/BL1" denote the bit lines of another bit line pair.

In the FeRAM according to this embodiment, each unit cell denoted by the reference character UC has a 1T/1C structure consisting of one transistor (a charge transfer transistor) and one capacitor. A dummy cell DC0, DC0', DC1, or DC1', which consists of one transistor (a charge transfer transistor) and one capacitor, is coupled to an associated one of the bit lines BL0, BL0', BL1, and BL1' at one side of the associated bit line (the right side of FIG. 2a).

The transistor of each unit cell UC is coupled at a gate thereof to an associated one of the word lines WL0, WL1, WL2, and WL3, at a drain (or a source) thereof to an associated one of the bit lines (inverted bit lines) BL0, BL0', BL1, and BL1', and at a source (a drain) thereof to one end of the capacitor included in the unit cell UC. The other end of the capacitor is connected to an associated one of plate electrode lines PL0, PL1, PL2, and PL3.

The transistors of the dummy cells DC0, DC0', DC1, and DC1' are coupled in common at their gates to a dummy word line DWL, and coupled at their drains (or sources) to the bit lines (or inverted bit lines) BL0, BL0', BL1, and BL1', respectively. The transistor of each dummy cell DC0, DC0', DC1, or DC1' is also coupled at its source (or its drain) to one end of the capacitor included in the dummy cell. The other end of the capacitor is connected to a dummy plate electrode lines DPL0 or DPL1. In the illustrated case, respective capacitors of the dummy cells DC0' and DC1 connected to the bit lines /BL0 and BL1 are connected to the dummy plate electrode DPL0 whereas respective capacitors of the dummy cells DC0 and DC1' connected to the bit lines /BL0 and BL1 are connected to the dummy plate electrode DPL1.

A switching transistor is arranged on each bit line between the portion of the bit line, to which unit cells are coupled, and the portion of the bit line, to which an associated one of the dummy cells are coupled. In the illustrated case, a switching transistor ST0 is arranged on the bit line /BL0 between the portion of the bit line /BL0, to which the unit cells C10' and C30' are coupled, and the portion of the bit line /BL0, to which the dummy cell DC0' is coupled. A switching transistor ST1 is arranged on the bit line /BL1 between the portion of the bit line /BL1, to which the unit cells C11' and C31' are coupled, and the portion of the bit line /BL1, to which the dummy cell DC1' is coupled. A switching transistor ST2 is arranged on the bit line BL0 between the portion of the bit line BL0, to which the unit cells C00 and C20 are coupled, and the portion of the bit line BL0, to which the dummy cell DC0 is coupled. A switching transistor ST3 is arranged on the bit line BL1 between the portion of the bit line BL1, to which the unit cells C01 and C21 are coupled, and the portion of the bit line BL1, to which the dummy cell DC1 is coupled. A switching transistor is also coupled between neighboring bit lines or neighboring inverted bit lines. In the illustrated case, a switching transistor ST4 is coupled at its source and drain to the bit lines /BL0 and /BL1, respectively. A switching transistor ST5 is coupled at its drain and source to the bit lines BL0 and BL1, respectively.

The switching transistors ST0 and ST1 are coupled in common at their gates to a control line CL0. The switching transistors ST2 and ST3 are coupled in common at their gates to a control line CL1. The switching transistor ST4 is coupled at its gate to a control line CL2. The switching transistor ST5 is coupled at its gate to a control line CL3. When data is to be stored or read out, a switching control signal from an external unit is applied to respective gates of the switching transistors ST0 to ST5.

As apparent from the above description, in the FeRAM according to this embodiment, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In accordance with this configuration, data read out from an optional unit cell is determined by applying, to a comparator C0 or C1, a voltage outputted from a bit line, on which the data from that unit cell is read out, along with a reference voltage outputted from bit lines neighboring to that bit line while having a potential inverse to the potential of the bit line, thereby comparing the applied voltages.

The procedures for storing data in the FeRAM having the above mentioned configuration according to this embodiment and reading out the stored data will be described in detail.

For the convenience and best understanding of description, it is assumed in the following description that a high voltage corresponds to "Vcc", a low voltage corresponds to 0 V, the potential variation of a bit line when output data is "1" corresponds to "V1", and the potential variation of the bit line when output data is "0" corresponds to "V0". Since the same data storing and reading procedures are carried out in all unit cells, these procedures will be described only in conjunction with one unit cell, for example, the unit cell C00.

First, the procedure for storing data "1" in the unit cell C00 will be described. In order to store data, the word line WL0, dummy word line OWL, and two control lines CL0 and CL1 are switched to their ON states, respectively. In this state, "Vcc" is applied to the bit line BL0 and the bit line BL1 associated the unit cell C01 neighboring to the unit cell C00 whereas "0 V" is applied to the bit line /BL0 and the bit line BL1. "0 V" is also applied to the plate electrode line PL0 and the dummy plate electrode line DPL1. "Vcc" is also applied to the dummy plate electrode line DPL0. Due to a potential difference resulting from such a voltage application, the ferroelectric film included in the unit cell C00 is polarized in a plus (+) direction. Accordingly, data "1" is stored.

As a result, data "1, 0, 0, 1" are stored in respective dummy cells DC0, DC0', DC1, and DC1' connected to the bit lines BL0, /BL0, BL1, and /BL1 in accordance with voltages applied thereto. When data is to be read out from an optional unit cell, the data stored in an associated one of the dummy cells DC0, DC0', DC1, and DC1' is used to generate a reference voltage required for a comparison with the voltage on the associated bit line.

That is, the reference voltage required for a comparison with the voltage on the bit line BL0 corresponds to an average voltage between the dummy cells DC0' and DC1'. The reference voltage required for a comparison with the voltage on the bit line /BL0 corresponds to an average voltage between the dummy cells DC0 and DC1. The reference voltage required for a comparison with the voltage on the bit line BL1 corresponds to an average voltage between the dummy cells DC0' and DC1'. The reference voltage required for a comparison with the voltage on the bit line /BL1 corresponds to an average voltage between the dummy cells DC0 and DC1.

Alternatively, the storing of data "1" in the unit cell C00 may be carried out in a fashion different from the above mentioned procedure. That is, in order to store data, the word line WL0, dummy word line DWL, and two control lines CL0 and CL1 are switched to their ON states, respectively. In this state, "Vcc" is applied to the bit line BL0 and /BL0 whereas "0 V" is applied to the bit lines BL1 and /BL1. "0 V" is also applied to the plate electrode line PL0 and the dummy plate electrode line DPL0. "Vcc" in also applied to the dummy plate electrode line DPL1. Due to a potential difference resulting from such a voltage application, the ferroelectric film included in the unit cell C00 is polarized in a plus (+) direction. Accordingly, data "1" is stored.

As a result, data "1, 0" are stored in respective dummy cells DC0' and DC1' connected to the bit lines /BL0 and /BL1 in accordance with voltages applied thereto, as compared to the above mentioned procedure. When data is to be read out from an optional unit cell, the data stored in an associated one of the dummy cells DC0' and DC1' is used to generate a reference voltage required for a comparison with the voltage on the associated bit line.

Now, the procedure for storing data "0" in the unit cell C00 will be described. In order to store data, the word line WL0, dummy word line DWL, and two control lines CL0 and CL1 are switched to their ON states, respectively. In this state, "0 V" is applied to the bit lines BL0 and /BL1 whereas "Vcc" is applied to the bit lines /BL0 and BL1. "Vcc" is also applied to the plate electrode line PL0 and the dummy plate electrode line DPL1. "0 V" is also applied to the dummy plate electrode line DPL0. Due to a potential difference resulting from such a voltage application, the ferroelectric film included in the unit cell C00 is polarized in a minus (−) direction. Accordingly, data "0" is stored.

As a result, data "0, 1, 1, 0" are stored in respective dummy cells DC0, DC0', DC1, and DC1' connected to the bit lines BL0, /BL0, BL1, and /BL1 in accordance with voltages applied thereto. When data is to be read out from an optional unit cell, the data stored in an associated one of the dummy cells DC0, DC1', DC1, and DC1' is used to generate a reference voltage required for a comparison with the voltage on the associated bit line, as in the above mentioned case associated with data "1".

Alternatively, the storing of data "0" in the unit cell C00 may be carried out in a fashion different from the above mentioned procedure. That is, in order to store data, the word line WL0, dummy word line DWL, and two control lines CL0 and CL1 are switched to their ON states, respectively. In this state, "0 V" is applied to the bit line BL0 and /BL0 whereas "Vcc" is applied to the bit line BL1 and /BL1. "Vcc" is also applied to the plate electrode line PL0 and the dummy plate electrode line DPL0. "0 V" is also applied to the dummy plate electrode line DPL1. Due to a potential difference resulting from such a voltage application, the ferroelectric film included in the unit cell C00 is polarized in a minus (−) direction. Accordingly, data "0" is stored.

As a result, data "0, 1" are stored in respective dummy cells DC0' and DC1' connected to the bit lines /BL0 and /BL1 in accordance with voltages applied thereto, as compared to the above mentioned procedure. When data is to be read out from an optional unit cell, the data stored in an associated one of the dummy cells DC0' and DC1' is used to generate a reference voltage required for a comparison with the voltage on the associated bit line, as in the above mentioned case associated with data "1".

As apparent from the above description, in the FeRAM according to this embodiment, data "1, 0, 0, 1" or data "0, 1, 1, 0" are stored in respective dummy cells DC0, DC0', DC1, and DC1' connected to the bit lines BL0, /BL0, SL1, and /BL1 in accordance with voltages applied to those lines when data "1" is inputted to the unit cell C00. When data "0" is inputted to the unit cell C00, data "0, 1, 1, 0" or data "1, 0, 0, 1" are stored in respective dummy cells DC0, DC0', DC1, and DC1' connected to the bit lines BL0, /BL0, BL1, and /BL1 in accordance with voltages applied to those lines.

The procedure for reading out data "1" or "0" stored in the unit cell C00 in accordance with the above mentioned procedure will now be described.

First, "Vcc" is applied to the bit line BL0, /BL0 and /BL1, and "0 V" is applied to the bit line BL1. Thereafter, the word line WL0, dummy word line DWL, and control line CL0 are switched to their ON states, respectively. When "0 V" is applied to the plate electrode line PL0 and the dummy plate electrode lines DPL0 and DPL1 in this state, a potential variation of "V1" or "V0" occurs on the bit line BL0 in accordance with the data stored in the unit cell C00. That is, where data "1" is stored, the potential variation of the bit line BL0 corresponds to "V1". On the other hand, where data "0" is stored, the potential variation of the bit line BL0 corresponds to "V0".

When the control line CL2 is subsequently switched to its ON state, the switching transistor ST4 is switched to its ON state. As a result, the average value between the dummy data stored in the dummy cell DC0' and the dummy data stored in the dummy cell DC1' is applied to the inverted bit line /BL0 as a reference voltage.

The reference voltage from the inverted bit line /BL0 is applied to the comparator C0 which also receives the voltage from the bit line BL0. Based on those voltages, the comparator C0 determines data read out from the unit cell C00. That is, when the voltage outputted from the bit line BL0 is higher than the reference voltage outputted from the inverted bit line /BL0, the data read out from the unit cell C00 is determined to be data "1". On the other hand, when the voltage outputted from the bit line BL0 is not higher than the reference voltage outputted from the inverted bit line /BL0, the data read out from the unit cell C00 is determined to be data "0".

As apparent from the above description, in the FeRAM according to this embodiment, which consists of M×N unit cells, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In accordance with this configuration, data read out from an optional unit cell is determined by comparing a voltage outputted from a bit line, on which the data from that unit cell is read out, with a reference voltage outputted from bit lines neighboring to that bit line while having a potential inverse to the potential of the bit line. Accordingly, it is possible to greatly enhance the reliability in the determination of data read out from the unit cells of the memory while achieving a high integration of the memory.

Figure 2B:
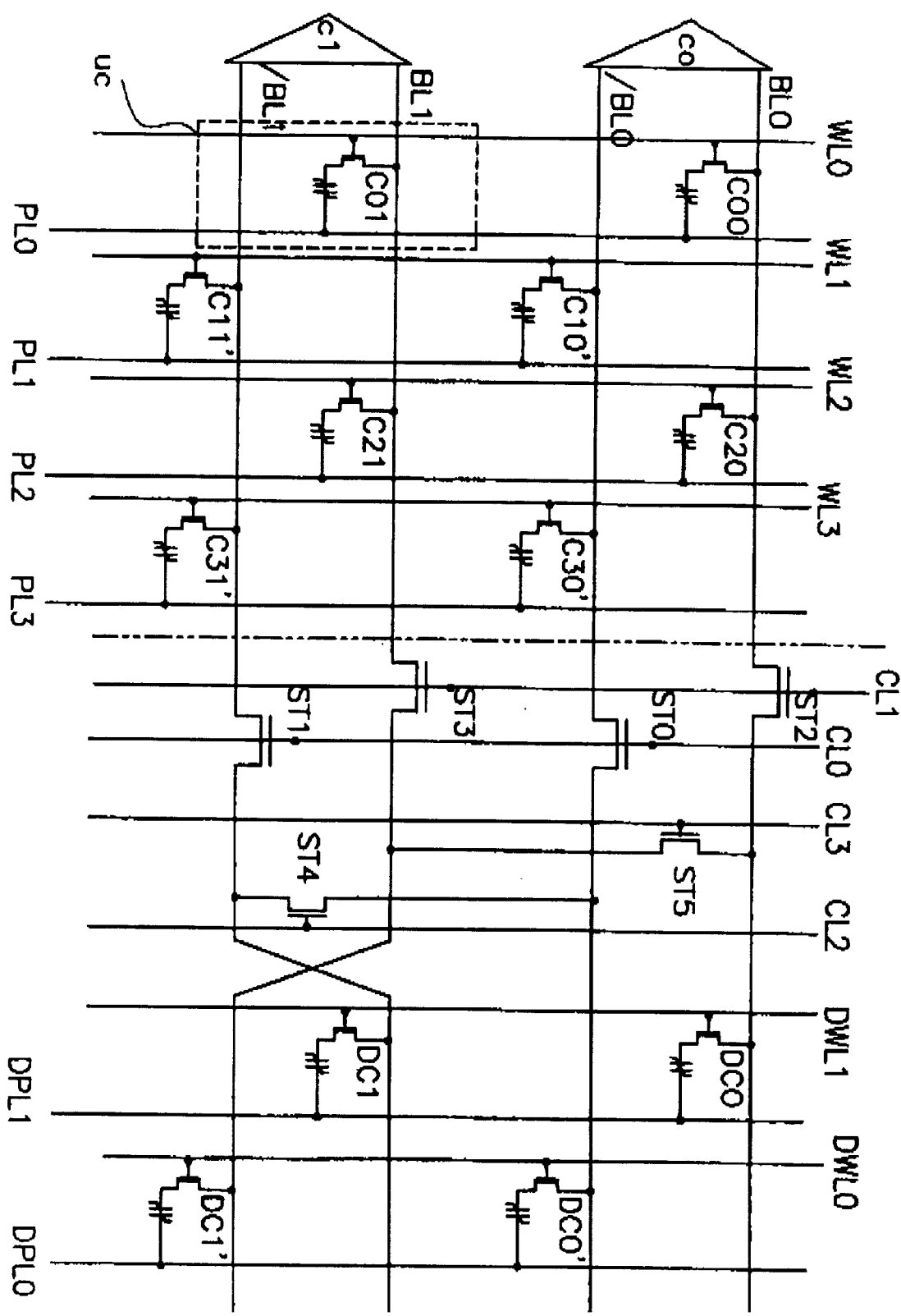
FIG. 2b is an equivalent circuit diagram illustrating a part of an FeRAM according to a first modified embodiment from the first embodiment of the present invention.

FIG. 2b is an equivalent circuit diagram illustrating a part of an FeRAM according to a first modified embodiment from the first embodiment of the present invention.

Referring to FIG. 2b, this first modified embodiment has the same configuration and arrangement as those of the first embodiment, except that the arrangement of the dummy cells DC0, DC0', DC1, and DC1' connected to respective bit lines have the same arrangement as that of the unit cells, that two dummy word lines DWL0 and DWL1 are used, in place of the single dummy word line DWL in the first embodiment, in such a fashion that one of the dummy word lines, that is, the dummy word line DWL1, is associated with the bit lines BL0 and BL1 (or the inverted bit lines) in odd rows (or even rows) whereas the other dummy word line, that is, the dummy word line DWL2, is associated with the inverted bit lines /BL0 and /BL1 (or the bit lines) in even rows (or odd rows).

In order to implement the arrangement of the dummy cells identical to that of the unit cells, the bit lines of one bit line pair, which consists of one bit line and one inverted bit line, for example, the bit lines BL1 and /BL1, cross each other in front of nodes thereof connected to the dummy cells DC1 and DC1' in such a fashion that the bit line BL1 is connected to the dummy cell DC1' whereas the bit line BL1' is connected to the dummy cell DC1.

In the FeRAM according to the first modified embodiment, the procedures for inputting data "1" or "0" to an optional unit cell, and reading out data stored in the optional unit cell are the same as those in the first embodiment. Accordingly, no further description will be made in conjunction with those procedures.

Figure 2C:
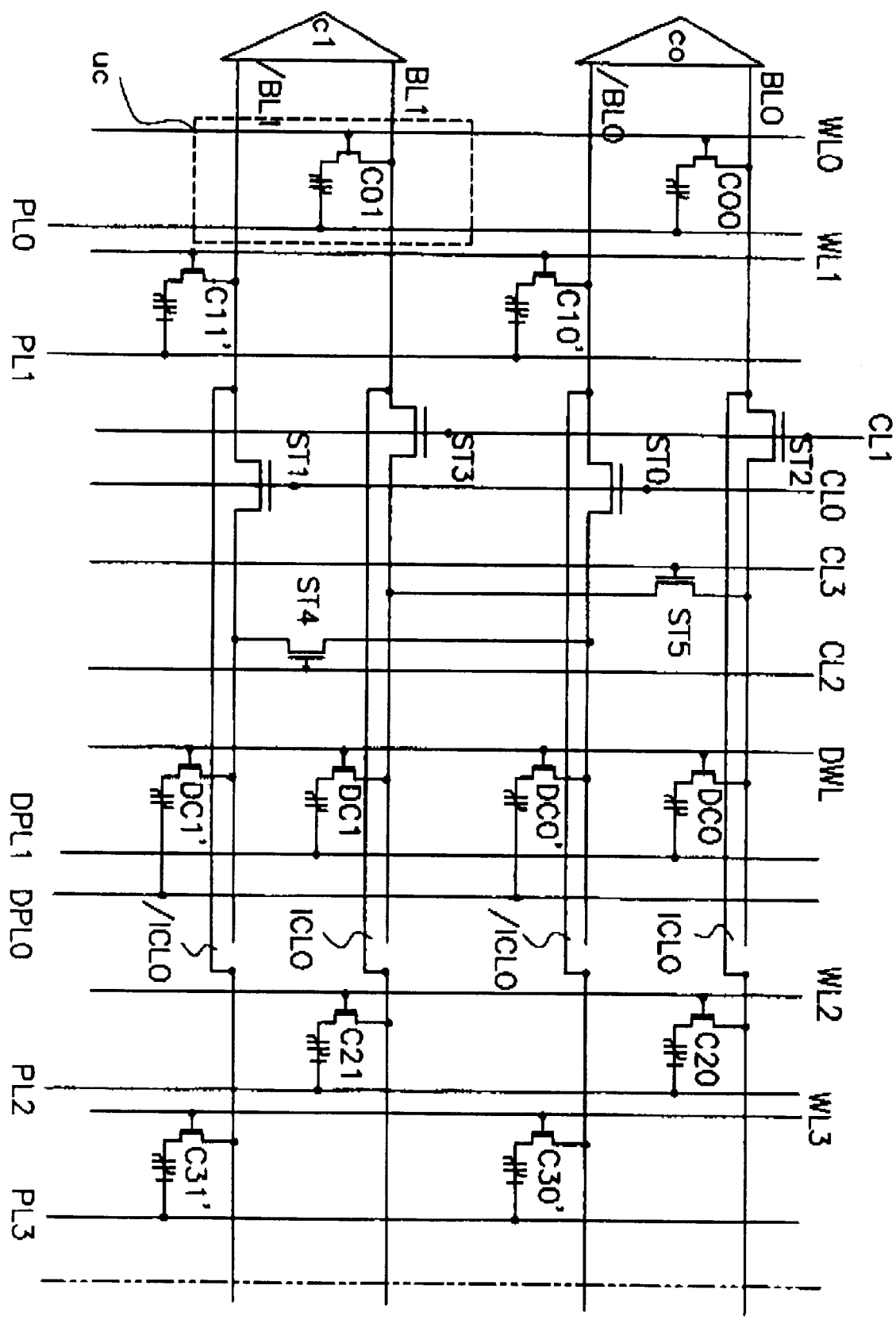
FIG. 2c is an equivalent circuit diagram illustrating a part of an FeRAM according to a second modified embodiment from the first embodiment of the present invention.

Although the FeRAM according to the first modified embodiment has slightly different configurations from those of the first embodiment in that the arrangement of the dummy cells is the same as the arrangement of the unit cells, and that two separate word lines are used in place of a single word line, the same effect as that of the first embodiment can be obtained.

is FIG. 2c is an equivalent circuit diagram illustrating a part of an FeRAM according to a second modified embodiment from the first embodiment of the present invention.

Referring to FIG. 2c, this second modified embodiment has the same arrangement as that of the first embodiment, except that the dummy cells DC0, DC0', DC1, and DC1' and switching transistors ST0 to ST5 are arranged at optional positions between unit cells neighboring to each other in a row direction, respectively. For such an arrangement, each bit line, on which a plurality of unit cells are connected, is divided into two separate portions. One dummy cell and one switching transistor are connected to one of the separate bit line portions. The separate bit line portions of each bit line are connected to each other by an interconnection line ICL0, /ICL0, ICL1, and /ICL1.

In the FeRAM according to the second modified embodiment, the procedures for inputting data to an optional unit cell, and reading out data stored in the optional unit cell are the same as those in the first embodiment. Accordingly, no further description will be made in conjunction with those procedures.

This second modified embodiment illustrates the fact that the dummy cells may be arranged at optional positions between unit cells neighboring to each other in a row direction, respectively.

Although the FeRAM according to the second modified embodiment has slightly different configurations from those of the first embodiment in that the dummy cells are arranged at optional positions between unit cells neighboring to each other in a row direction, respectively, the same effect as that of the first embodiment can be obtained by dividing each bit line into two separate portions, and appropriately connecting the separate bit line portions by an interconnection line.

[Second Embodiment]

Figure 3A:
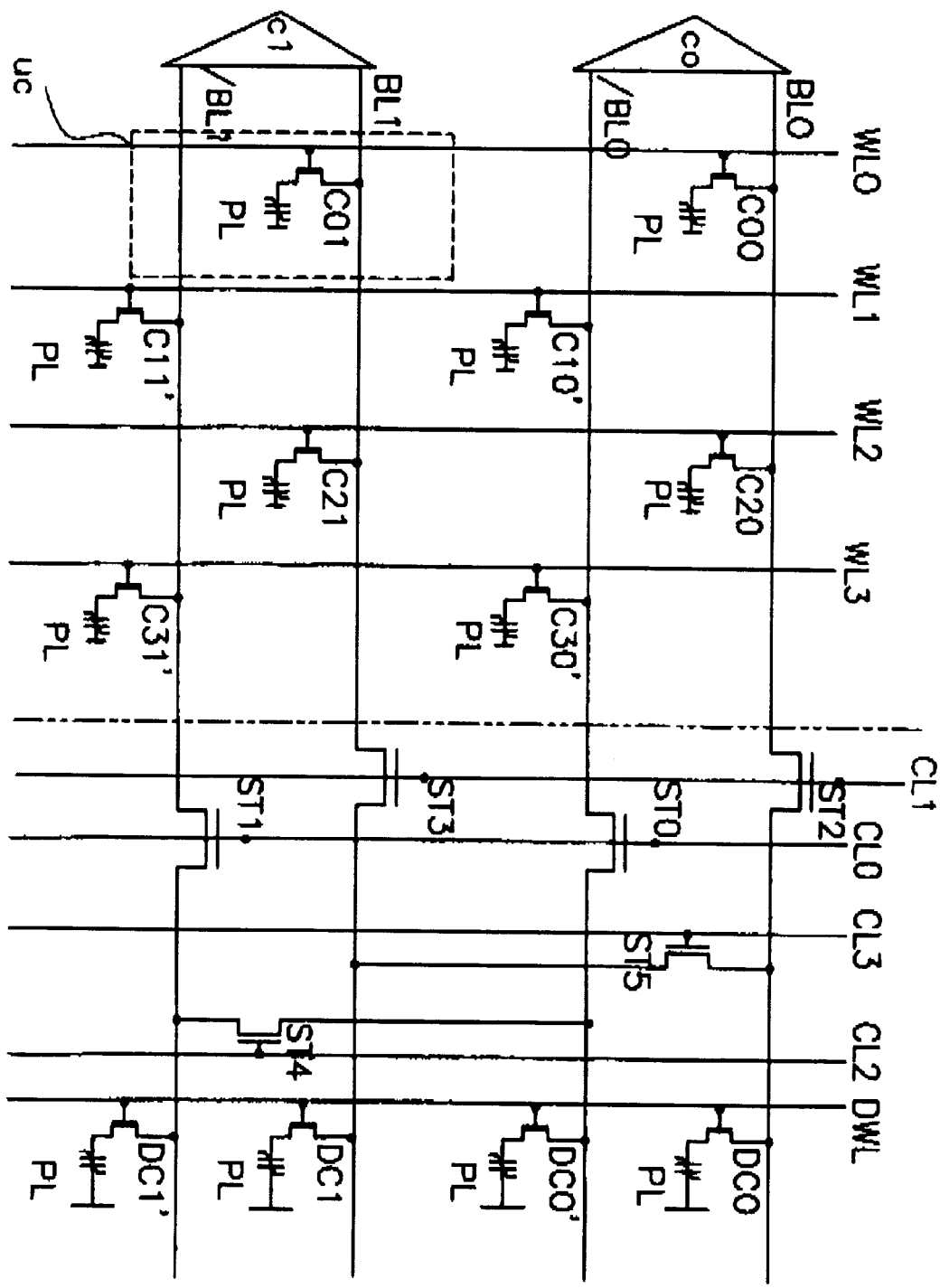
FIG. 3a is an equivalent circuit diagram illustrating a part of an FeRAM in accordance with a second embodiment of the present invention.

FIG. 3a is an equivalent circuit diagram illustrating a part of an FeRAM in accordance with a second embodiment of the present invention.

Referring to FIG. 3a, the FeRAM according to this embodiment is substantially identical to the first embodiment in terms of the arrangements of diverse lines including bit lines, word lines, dummy word line, and control lines, and unit cells, dummy cells, and switching transistors arranged in an interconnected fashion by those lines. However, the FeRAM according to this embodiment is different from the first embodiment in that a common plate electrode line is used, in place of separate plate electrode lines.

That is, the FeRAM according to the first embodiment uses separate plate electrode lines corresponding to respective columns, and separate dummy plate electrode lines corresponding to respective columns, in order to selectively apply a high voltage Vcc or a low voltage 0 V to respective plate electrodes of the unit cells and dummy cells. However, the FeRAM according to the second embodiment uses a configuration in which a single plate electrode line connected in common to all plate electrodes of the unit cells and dummy cells is used, so that a voltage of a certain level, for example, "Vcc/2", is applied to respective plate electrodes of the unit cells and dummy cells.

In order to avoid an unnecessarily repeated description for the second embodiment, no description will be made in conjunction with the whole arrangement of the FeRAM according to this embodiment. In the following description, only the procedure for storing data in the FeRAM according to this embodiment using the common plate electrode line, and reading out the stored data will be described.

For the convenience and best understanding of description, it is assumed in the following description that a high voltage corresponds to "Vcc", and a low voltage corresponds to 0 V. Also, it is assumed that a voltage Vp having a voltage level substantially intermediate between the high voltage and low voltage, for example, "Vcc/2", is applied to all plate electrodes. It is also assumed that , the potential variation of a bit line when output data is "1" corresponds to "V1", and the potential variation of the bit line when output data is "0" corresponds to "V0". Since the same data storing and reading procedures are carried out in all unit cells, these procedures will be described only in conjunction with one unit cell, for example, the unit cell C00.

First, the procedure for storing data "1" in the unit cell C00 will be described. In order to store data, the word line WL0, dummy word line DWL, and two control lines CL0 and CL1 are switched to their ON states, respectively. In this state, "Vcc" is applied to the bit line BL0 and the bit line /BL1 associated the unit cell C01 neighboring to the unit cell C00 whereas "0 V" is applied to the bit line /BL0. "VP" is applied to the bit line BL1. "Vp" is also applied to plate electrodes PL via the common plate electrode line. Due to a potential difference resulting from such a voltage application, the ferroelectric film included in the unit cell C00 is polarized in a plus (+) direction. Accordingly, data "1" is stored.

As a result, data "1, 0, 1" are stored in respective dummy cells DC0, DC0', and DC1' connected to the bit lines BL0, /BL0, and /BL1 in accordance with the voltages "Vcc" and "0 V" applied thereto. When data is to be read out from an optional unit cell on the bit line BL0, the data stored in the dummy cells DC0' and DC1' are used to generate a reference voltage required for a comparison with the voltage on the bit line BL0.

That is, the reference voltage required for a comparison with the voltage on the bit line BL0 corresponds to an average voltage between the dummy cells DC0' and DC1'. The reference voltage required for a comparison with the voltage on the bit line /BL0 corresponds to an average voltage between the dummy cells DC0 and DC1. The reference voltage required for a comparison with the voltage on the bit line BL1 corresponds to an average voltage between the dummy cells DC0' and DC1'. The reference voltage required for a comparison with the voltage on the bit line /BL1 corresponds to an average voltage between the dummy cells DC1 and DC1.

Alternatively, the storing of data "1" in the unit cell C00 may be carried out in a fashion different from the above mentioned procedure. That is, in order to store data, the word line WL0, dummy word line DWL, and two control lines CL0 and CL1 are switched to their ON states, respectively. In this state, "Vcc" is applied to the bit line BL0 and /BL0 whereas "0 V" is applied to the bit lines BL1 and /BL1. "0 V" is also applied to the bit line /BL1. "Vp" is applied to the bit line /BL1. "Vp" is also applied to the plate electrodes PL. Due to a potential difference resulting from such a voltage application, the ferroelectric film included in the unit cell C00 is polarized in a plus (+) direction. Accordingly, data "1" is stored.

As a result, data "1, 1, 0" are stored in respective dummy cells DC0, DC0', and DC1' connected to the bit lines BL0, /BL0, and /BL1 in accordance with the voltages "Vcc" and "0 V" applied thereto. When data is to be read out from an optional unit cell on the bit line BL0, the data stored in the dummy cells DC0' and DC1' are used to generate a reference voltage required for a comparison with the voltage on the bit line BL0.

Now, the procedure for storing data "0" in the unit cell C00 will be described. In order to store data, the word line WL0, dummy word line DWL, and two control lines CL0 and CL1 are switched to their ON states, respectively. In this state, "0 V" is applied to the bit line BL0 and /BL1 whereas "Vcc" is applied to the bit line /BL0. Also, "Vp" is applied to the bit line BL1. "Vp" is also applied to the plate electrodes PL. Due to a potential difference resulting from such a voltage application, the ferroelectric film included in the unit cell C00 is polarized in a minus (-) direction. Accordingly, data "0" is stored.

As a result, data "0, 1, 0" are stored in respective dummy cells DC0, DC0', and DC1' connected to the bit lines BL0, /BL0, and /BL1 in accordance with the voltages "0 V" and "Vcc" applied thereto. When data is to be read out from an optional unit cell on the bit line BL0, the data stored in the dummy is cells DC0' and DC1' are used to generate a reference voltage required for a comparison with the voltage on the bit line BL0.

Alternatively, the storing of data "0" in the unit cell C00 may be carried out in a fashion different from the above mentioned procedure. That is, in order to store data, the word line WL0, dummy word line DWL, and two control lines CL0 and CL1 are switched to their ON states, respectively. In this state, "0 V" is applied to the bit line BL0 and /BL0 whereas "Vcc" is applied to the bit line /BL1. Also, "Vp" is applied to the bit line BL1. "Vp" is also applied to the plate electrodes PL. Due to a potential difference resulting from such a voltage application, the ferroelectric film included in the unit cell C00 is polarized in a minus (−) direction. Accordingly, data "0" is stored.

As a result, data "0, 0, 1" are stored in respective dummy cells DC0, DC0', and DC1' connected to the bit lines BL0, /BL0, and /BL1 in accordance with the voltages "Vcc" and "0 V" applied thereto, as compared to the above mentioned procedure. When data is to be read out from an optional unit cell on the bit line BL0, the data stored in the dummy cells DC0' and DC1' are used to generate a reference voltage required for a comparison with the voltage on the bit line BL0.

As apparent from the above description, in the FeRAM according to this embodiment, data "1, 0, 1" or data "1, 1, 0" are stored in respective dummy cells DC0, DC0', and DC1' connected to the bit lines BL0, /BL0, and /BL1 in accordance with voltages applied to those lines when data "1" is inputted to the unit cell C00. When data "0" is inputted to the unit cell C00, data "0 0, 1, 0" or data "0, 0, 1" are stored in respective dummy cells DC0, DC0', and DC1' connected to the bit lines BL0, /BL0, and /BL1 in accordance with voltages applied to those lines.

The procedure for reading out data "1" or "0" stored in the unit cell C00 in accordance with the above mentioned procedure will now be described.

First, "Vcc" is applied to the bit line BL0, /BL0 and /BL1, and "Vp" is applied to the bit line BL1. Thereafter, the word line WL0, dummy word line DWL, and control line CL0 are switched to their ON states, respectively. When "Vp" is applied to the plate electrodes PL in this state, a potential variation of "V1" or "V0" occurs on the bit line BL0 in accordance with the data stored in the unit cell C00. That is, where data "1" is stored, the potential variation of the bit line BL0 corresponds to "V1". On the other hand, where data "0" is stored, the potential variation of the bit line BL0 corresponds to "V0".

When the control line CL2 is subsequently switched to its ON state, the switching transistor ST4 is switched to its ON state. As a result, the average value between the dummy data stored in the dummy cell DC0' and the dummy data stored in the dummy cell DC1' is applied to the inverted bit line /BL0 as a reference voltage.

The reference voltage from the inverted bit line /BL0 is applied to the comparator C0 which also receives the voltage from the bit line BL0. Based on those voltages, the comparator C0 determines data read out from the unit cell C00. That is, when the voltage outputted from the bit line BL0 is higher than the reference voltage outputted from the inverted bit line /BL0, the data read out from the unit cell C00 is determined to be data "1". On the other hand, when the voltage outputted from the bit line BL0 is not higher than the reference voltage outputted from the inverted bit line /BL0, the data read out from the unit cell C00 is determined to be data "0".

As apparent from the above description, in the FeRAM according to this embodiment, which consists of M×N unit cells, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In accordance with this configuration, data read out from an optional unit cell is determined by comparing a voltage outputted from a bit line, on which the data from that unit cell is read out, with a reference voltage outputted from bit lines neighboring to that bit line while having a potential inverse to the potential of the bit line. Accordingly, in accordance with this embodiment, the same effects as those in the above mentioned first embodiment are obtained. That is, it is possible to greatly enhance the reliability in the determination of data read out from the unit cells of the memory while achieving a high integration of the memory.

Since the configuration for connecting in common the plate electrodes of unit cells and dummy cells is used in accordance with this embodiment, an additional effect is obtained in that the capacitance in each unit cell is increased within a given area.

Figure 3B:
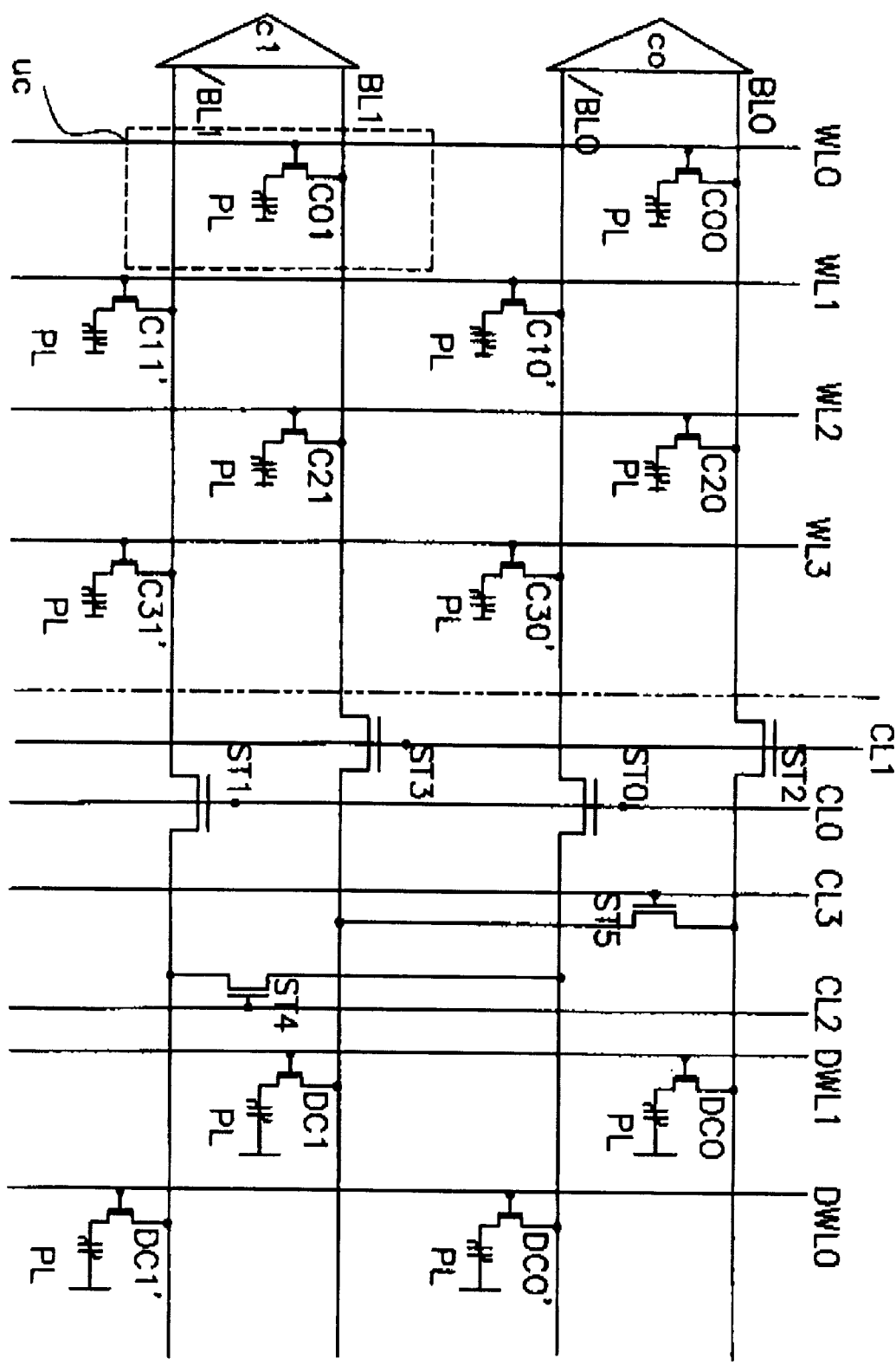
FIG. 3b is an equivalent circuit diagram illustrating a part of an FeRAM according to a first modified embodiment from the second embodiment of the present invention.

FIG. 3b is an equivalent circuit diagram illustrating a part of an FeRAM according to a first modified embodiment from the second embodiment of the present invention.

Referring to FIG. 3b, this first modified embodiment has the same configuration and arrangement as those of the second embodiment, except that the arrangement of the dummy cells DC0, DC0', DC1, and DC1' connected to respective bit lines DC0, DC0', DC1, and DC1' have the same arrangement as that of the unit cells, that two dummy word lines DWL0 and DWL1 are used, in place of the single dummy word line DWL in the second embodiment, in such a fashion that one of the dummy word lines, that is, the dummy word line DWL1, is associated with the bit lines BL0 and BL1 (or the inverted bit lines) in odd rows (or even rows) whereas the other dummy word line, that is, the dummy word line DWL2, is associated with the inverted bit lines /BL0 and /BL1 (or the bit lines) in even rows (or odd rows).

In the FeRAM according to the first modified embodiment, the procedures for inputting data "1" or "0" to an optional unit cell, and reading out data stored in the optional unit cell are the same as those in the second embodiment. Accordingly, no further description will be made in conjunction with those procedures, in order to avoid an unnecessarily repeated description.

Although the FeRAM according to the first modified embodiment has slightly different configurations from those of the second embodiment in that the arrangement of the dummy cells is the same as the arrangement of the unit cells, and that two separate word lines are used in place of a single word line, the same effect as that of the second embodiment can be obtained.

Figure 3C:
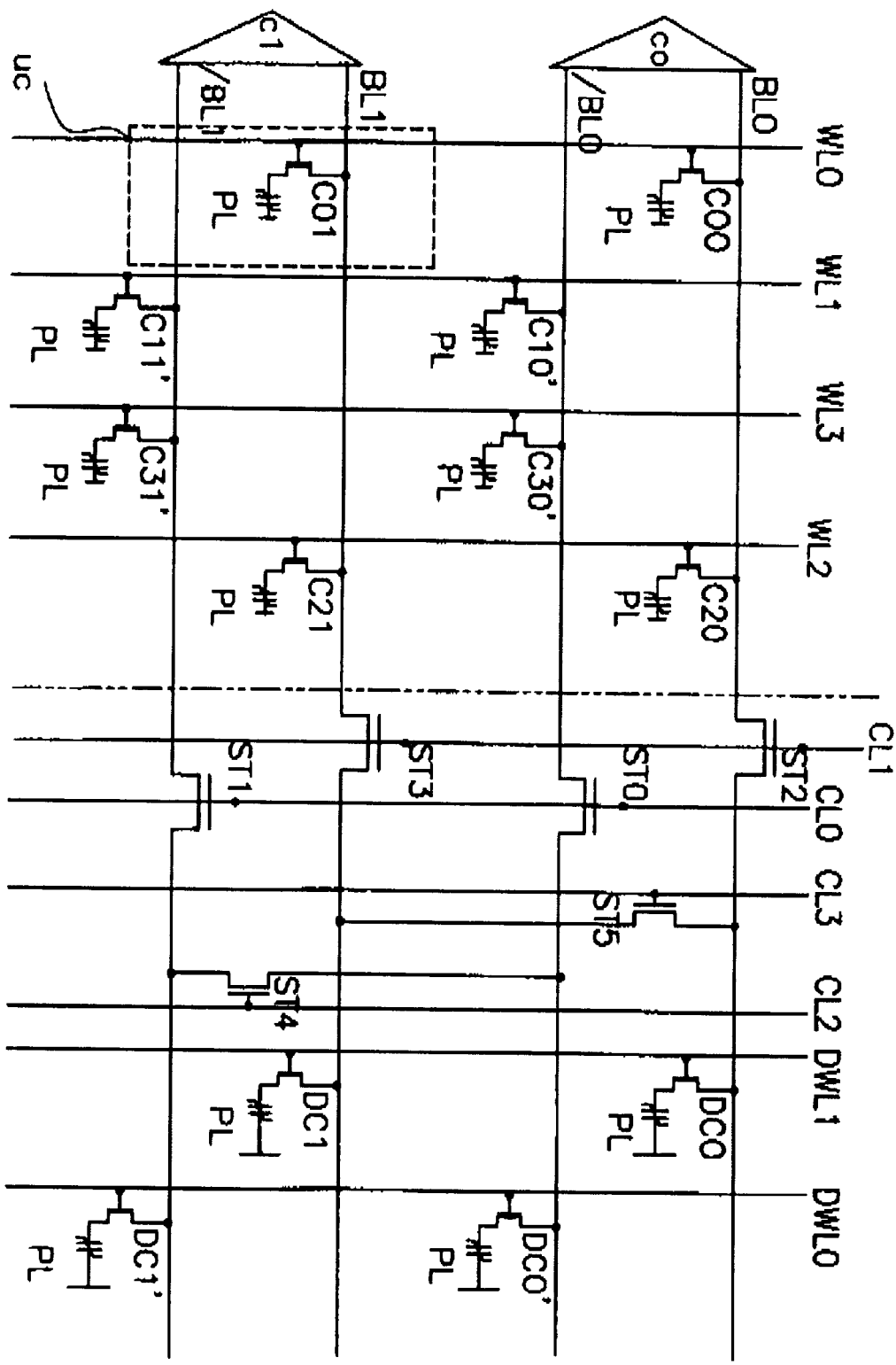
FIG. 3c is an equivalent circuit diagram illustrating a part of an FeRAM according to a second modified embodiment from the second embodiment of the present invention.

FIG. 3c is an equivalent circuit diagram illustrating a part of an FeRAM according to a second modified embodiment from the second embodiment of the present invention.

Referring to FIG. 3c, this second modified embodiment has the same configuration and arrangement as those of the second embodiment, except that the unit cells of the same row connected in series on each of bit lines BL0, /BL0, BL1, and /BL1 are arranged in pair, and that the dummy cells DC0, DC0', DC1, and DC1' have the same arrangement as that of the unit cells. In order to implement such an arrangement according to the second modified embodiment, two dummy word lines DWL0 and DWL1 are used, in place of the single dummy word line DWL in the second embodiment, in such a fashion that one of the dummy word lines, that is, the dummy word line DWL1, is associated with the bit lines BL0 and BL1 (or the inverted bit lines) in odd rows (or even rows) whereas the other dummy word line, that is, the dummy word line DWL2, is associated with the inverted bit lines /BL0 and /BL1 (or the bit lines) in even rows (or odd rows).

In the FeRAM according to this second modified embodiment, the procedures for inputting data "1" or "0" to an optional unit cell, and reading out data stored in the optional unit cell are the same as those in the second embodiment. Accordingly, no further description will be made in conjunction with those procedures, in order to avoid an unnecessarily repeated description.

Although the FeRAM according to the first modified embodiment has slightly different configurations from those of the second embodiment in that the unit cells of the same row connected in series on each bit line are arranged in pair, that the dummy cells have the same arrangement as that of the unit cells, and that two dummy word lines are used, in place of a single dummy word line, the same effect as that of the second embodiment can be obtained.

Figure 3D:
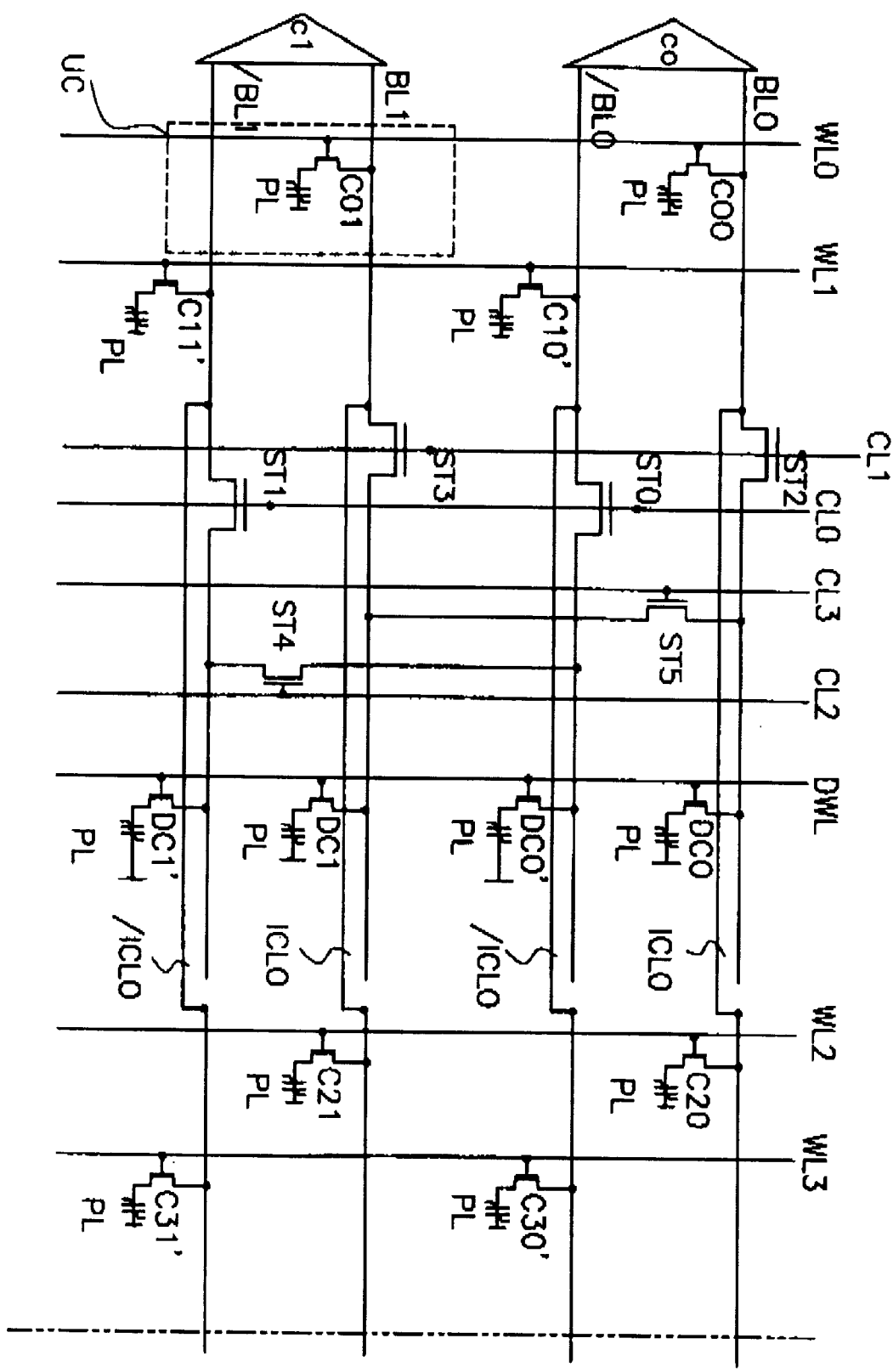
FIG. 3d is an equivalent circuit diagram illustrating a part of an FeRAM according to a second modified embodiment from the third embodiment of the present invention.

FIG. 3d is an equivalent circuit diagram illustrating a part of an FeRAM according to a second modified embodiment from the third embodiment of the present invention.

Referring to FIG. 3d, this third modified embodiment has the same arrangement as that of the second embodiment, except that the dummy cells DC0, DC0', DC1, and DC1' and switching transistors ST0 to ST5 are arranged at optional positions between unit cells neighboring to each other in a row direction, respectively. For such an arrangement, each bit line, on which a plurality of unit cells are connected, is divided into two separate portions. One dummy cell and one switching transistor are connected to one of the separate bit line portions. The separate bit line portions of each bit line are connected to each other by an interconnection line ICL0, /ICL0, ICL1, and /ICL1.

In the FeRAM according to the third modified embodiment, the procedures for inputting data to an optional unit cell, and reading out data stored in the optional unit cell are the same as those in the second embodiment. Accordingly, no further description will be made in conjunction with those procedures.

This third modified embodiment illustrates the fact that the dummy cells may be arranged at optional positions between unit cells neighboring to each other in a row direction, respectively.

Although the FeRAM according to the third modified embodiment has slightly different configurations from those of the second embodiment in that the dummy cells are arranged at optional positions between unit cells neighboring to each other in a row direction, respectively, the same effect as that of the second embodiment can be obtained by dividing each bit line into two separate portions, and appropriately connecting the separate bit line portions by an interconnection line.

[Third Embodiment]

Figure 4A:
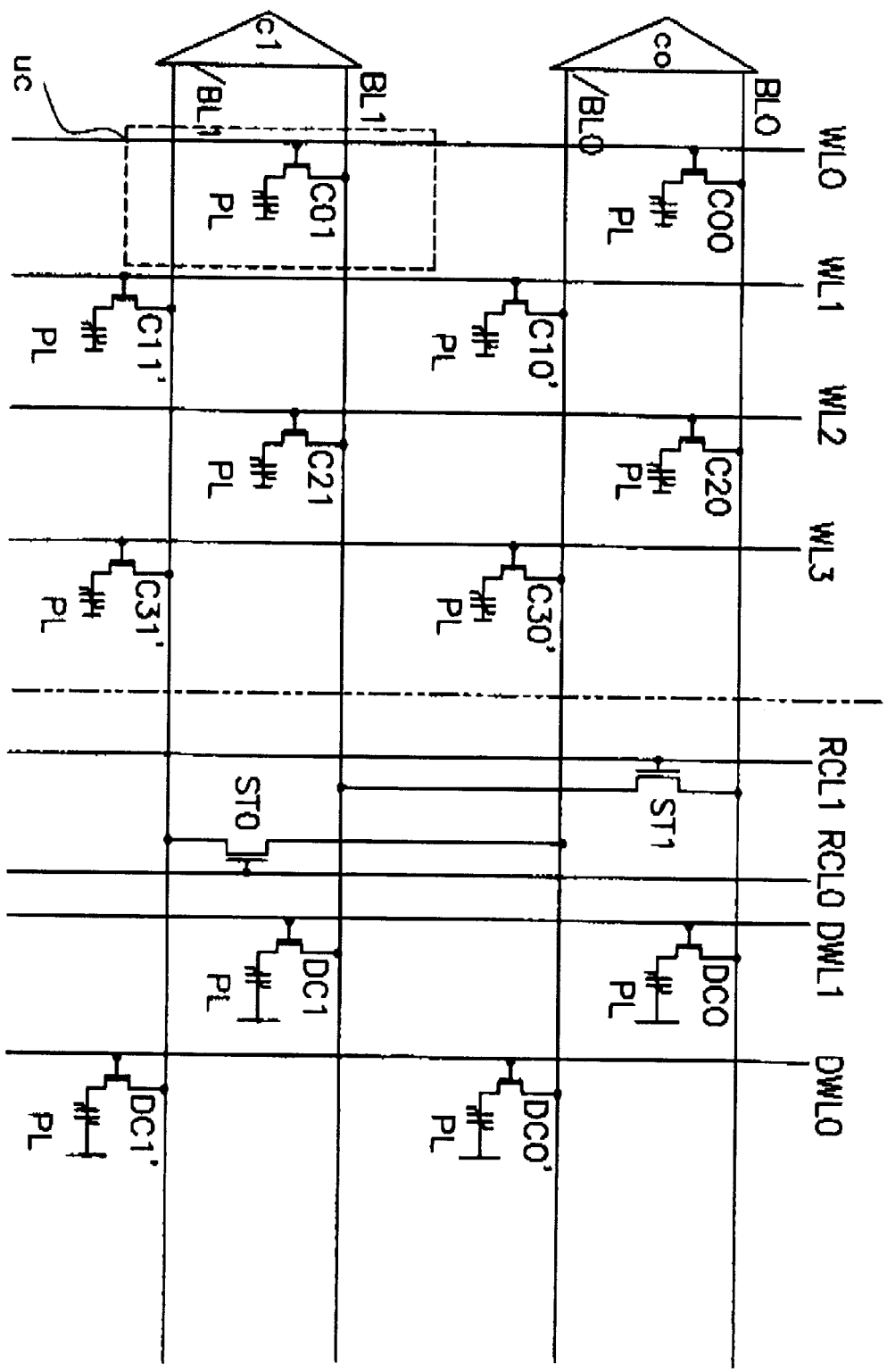
FIG. 4a is an equivalent circuit diagram illustrating a part of an FeRAM in according with a third embodiment of the present invention.

FIG. 4a is an equivalent circuit diagram illustrating a part of an FeRAM in accordance with a third embodiment of the present invention.

Referring to FIG. 4a, the FeRAM according to this embodiment is identical to respective first modified embodiments from the above mentioned embodiments of the present invention. That is, in this embodiment, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line so that for a determination of data read out from an optional unit cell, a voltage outputted from a bit line, on which the data from that unit cell is read out, is compared with a reference voltage outputted from bit lines neighboring to that bit line while having a potential inverse to the potential of the bit line. The dummy cells also have the same arrangement as that of the unit cells. In order to implement such configurations and arrangements according to this embodiment, two dummy word lines DWL0 and DWL1 are used, in place of the single dummy word line DWL in the second embodiment, in such a fashion that one of the dummy word lines, that is, the dummy word line DWL1, is associated with the bit lines BL0 and BL1 (or the inverted bit lines) in odd rows (or even rows) whereas the other dummy word line, that is, the dummy word line DWL2, is associated with the inverted bit lines /BL0 and /BL1 (or the bit lines) in even rows (or odd rows).

However, the FeRAM according to this embodiment is different from the FeRAM according to each of the first modified embodiments from the above mentioned embodiments in which switching transistors are arranged on the bit lines, respectively, and another switching transistors are provided to connect bit lines neighboring to each other in an interlaced fashion. That is, the FeRAM according to this embodiment only includes switching transistors each adapted to connect bit lines neighboring to each other in an interlaced fashion. Each switching transistor adapted to connect bit lines neighboring to each other in an interlaced fashion serves to store dummy data in dummy cells respectively connected to those bit lines when a bit line neighboring to those bit lines is selected to store data therein, while outputting, as a reference voltage, an average voltage between the connected bit lines when the bit line stored with the data is selected to read out the stored data.

In order to avoid an unnecessarily repeated description for the third embodiment, no description will be made in conjunction with the whole arrangement of the FeRAM according to this embodiment. In the following description, only the procedure for storing data in the FeRAM according to this embodiment using a simplified switching transistor arrangement, and reading out the stored data will be described.

For the convenience and best understanding of description, it is assumed in the following description that a high voltage corresponds to "Vcc", and a low voltage corresponds to 0 V. Also, it is assumed that a voltage Vp having a voltage level substantially intermediate between the high voltage and low voltage, for example, "Vcc/2", is applied to all plate electrodes. It is also assumed that, the potential variation of a bit line when output data is "1" corresponds to "V1", and the potential variation of the bit line when output data is "0" corresponds to "V0". Since the same data storing and reading procedures are carried out in all unit cells, these procedures will be described only in conjunction with one unit cell, for example, the unit cell C00.

First, the procedure for storing data "1" in the unit cell C00 will be described. In order to store data, the word line WL0 and dummy word line DWL0 are switched to their ON states, respectively. In this state, "Vcc" is applied to the bit line BL0 and the bit line /BL1 associated the unit cell C01 neighboring to the unit cell C00 whereas "0 V" is applied to the bit line /BL0. "Vp" is applied to the bit line BL1. "Vp" is also applied to plate electrodes PL via a common plate electrode line. Due to a potential difference resulting from such a voltage application, the ferroelectric film included in the unit cell C00 is polarized in a plus (+) direction. Accordingly, data "1" is stored.

As a result, data "0, 1" are stored in respective dummy cells DC0' and DC' connected to the bit lines /BL0 and /BL1 in accordance with the voltages "Vcc" and "0 V" applied thereto. When data is to be read out from an optional unit cell on the bit line BL0, the data stored in the dummy cells DC0' and DC1' are used to generate a reference voltage required for a comparison with the voltage on the bit line BL0.

That is, the average voltage between the dummy cells DC0' and DC1' is used as a reference voltage required for a comparison with the voltage on the bit line BL0 when data is to be read out from an optional unit cell on the bit line BL0.

Alternatively, the storing of data "1" in the unit cell C00 may be carried out in a fashion different from the above mentioned procedure. That is, in order to store data, the word line WL0 and dummy word line DWL0 are switched to their ON states, respectively. In this state, "Vcc" is applied to the bit line BL0 and /BL0 whereas "0 V" is applied to the bit line /BL1. Also, "Vp" is applied to the bit line BL1. "Vp" is also applied to the plate electrodes PL. Due to a potential difference resulting from such a voltage application, the ferroelectric film included in the unit cell C00 is polarized in a plus (+) direction. Accordingly, data "1" is stored.

As a result, data "1, 0" are stored in respective dummy cells DC0' and DC1' connected to the bit lines /BL0 and /BL1 in accordance with the voltages "Vcc" and "0 V" applied thereto. When data is to be read out from an optional unit cell on the bit line BL0, the data stored in the dummy cells DC0' and DC1' are used to generate a reference voltage required for a comparison with the voltage on the bit line BL0.

Now, the procedure for storing data "0" in the unit cell C00 will be described. In order to store data, the word line WL0 and dummy word line DWL0 are switched to their ON states, respectively. In this state, "0 V" is applied to the bit line BL0 and /BL1 whereas "Vcc" is applied to the bit line /BL0. Also, "Vp" is applied to the bit line BL1. "Vp" is also applied to the plate electrodes PL. Due to a potential difference resulting from such a voltage application, the ferroelectric film included in the unit cell C00 is polarized in a minus (−) direction. Accordingly, data "0" is stored.

As a result, data "1, 0" are stored in respective dummy cells DC0' and DC1' connected to the bit lines /BL0 and /BL1 in accordance with the voltages "0 V" and "Vcc" applied thereto. When data is to be read out from an optional unit cell on the bit line BL0, the data stored in the dummy cells DC0' and DC1' are used to generate a reference voltage required for a comparison with the voltage on the bit line BL0.

That is, the average voltages between the dummy data outputted from the dummy cell DC0' and the dummy data outputted from the dummy cell DC1' is used as a reference voltage required for a comparison conducted for a data determination when data is read out from an optional unit cell on the bit line BL0.

Alternatively, the storing of data "0" in the unit cell C00 may be carried out in a fashion different from the above mentioned procedure. That is, in order to store data, the word line WL0 and dummy word line DWL0 are switched to their ON states, respectively. In this state, "0 V" is applied to the bit line BL0 and /BL0 whereas "Vcc" is applied to the bit line /BL1. Also, "Vp" is applied to the bit line BL1. "Vp" is also applied to the plate electrodes PL. Due to a potential difference resulting from such a voltage application, the ferroelectric film included in the unit cell C00 is polarized in a minus (−) direction. Accordingly, data "0" is stored.

As a result, data "0, 1" are stored in respective dummy cells DC0, DC0', and DC1' connected to the bit lines /BL0 and /BL1 in accordance with the voltages "0 V" and "Vcc" applied thereto. When data is to be read out from an optional unit cell on the bit line BL0, the data stored in the dummy cells DC0' and DC1' are used to generate a reference voltage required for a comparison with the voltage on the bit line BL0.

As apparent from the above description, in the FeRAM according to this embodiment, data "0, 1" or data "1, 0" are stored in respective dummy cells DC0' and DC1' connected to the bit lines /BL0 and /BL1 in accordance with voltages applied to those lines when data "1" is inputted to the unit cell C00. When data "0" is inputted to the unit cell C00, data "1, 0" or data "0, 1" are stored in respective dummy cells DC0' and DC1' connected to the bit lines /BL0 and /BL1 in accordance with voltages applied to those lines.

The procedure for reading out data "1" or "0" stored in the unit cell C00 in accordance with the above mentioned procedure will now be described.

First, "Vcc" is applied to the bit line BL0, /BL0 and /BL1, and "Vp" is applied to the bit line BL1. Thereafter, the word line WL0 and dummy word line DWL0 are switched to their ON states, respectively. When "Vp" is applied to the plate electrodes PL in this state, a potential variation of "V1" or "V0" occurs on the bit line BL0 in accordance with the data stored in the unit cell C00. That is, where data "1" is stored, the potential variation of the bit line BL0 corresponds to "0 V". On the other hand, where data "0" is stored, the potential variation of the bit line BL0 corresponds to "V0".

When a control line RCL0 is subsequently switched to its ON state, the switching transistor ST0 connected to the control line RCL0 is switched to its ON state. As a result, the average value between the dummy data stored in the dummy cell DC0' and the dummy data stored in the dummy cell DC1' is applied to the inverted bit line /BL0 as a reference voltage.

The reference voltage from the inverted bit line /BL0 is applied to the comparator C0 which also receives the voltage from the bit line BL0. Based on those voltages, the comparator C0 determines data read out from the unit cell C00. That is, when the voltage outputted from the bit line BL0 is higher than the reference voltage outputted from the inverted bit line /BL0, the data read out from the unit cell C00 is determined to be data "1". On the other hand, when the voltage outputted from the bit line BL0 is not higher than the reference voltage outputted from the inverted bit line /BL0, the data read out from the unit cell C00 is determined to be data "0".

As apparent from the above description, in the FeRAM according to this embodiment, which consists of M×N unit cells, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In accordance with this configuration, data read out from an optional unit cell is determined by comparing a voltage outputted from a bit line, on which the data from that unit cell is read out, with a reference voltage outputted from bit lines neighboring to that bit line while having a potential inverse to the potential of the bit line. Accordingly, in accordance with this embodiment, the same effects as those in the above mentioned embodiments are obtained. That is, it is possible to greatly enhance the reliability in the determination of data read out from the unit cells of the memory while achieving a high integration of the memory.

Since the configuration for connecting in common the plate electrodes of unit cells and dummy cells is used in accordance with this embodiment, an additional effect is obtained in that the capacitance in each unit cell is increased within a given area, as in respective first modified embodiments of the above mentioned embodiments.

Furthermore, the FeRAM according to this embodiment provides another advantage in that a simplification in arrangement is achieved, as compared to the FeRAM according to respective first modified embodiment of the above mentioned embodiments, because the arrangement for storing and reading out dummy data is implemented only using the switching transistors adapted to connect bit lines neighboring to each other in an interlaced fashion.

Figure 4B:
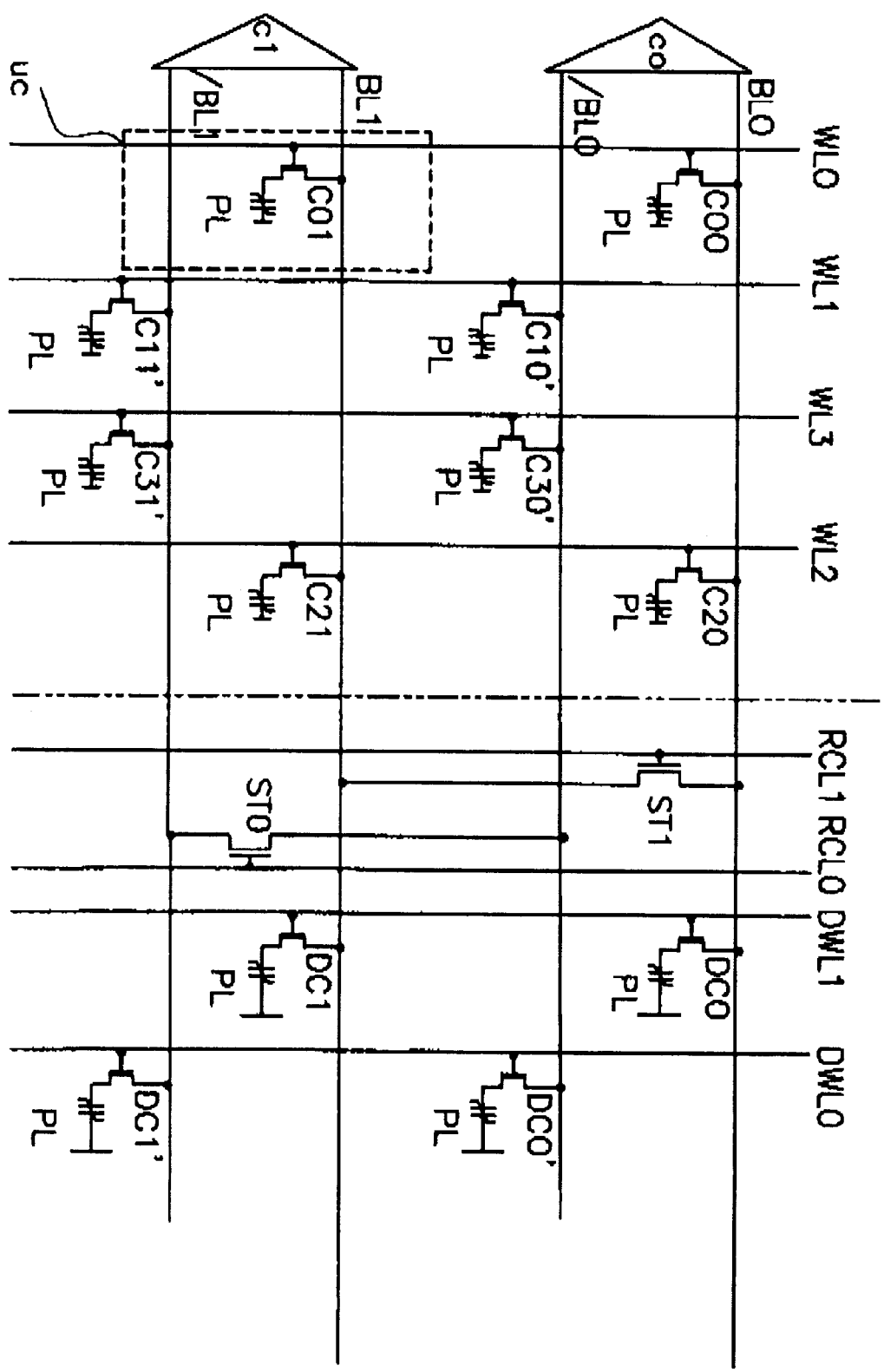
FIG. 4b is an equivalent circuit diagram illustrating a part of an FeRAM according to a second modified embodiment from the second embodiment of the present invention.
Figure 5:
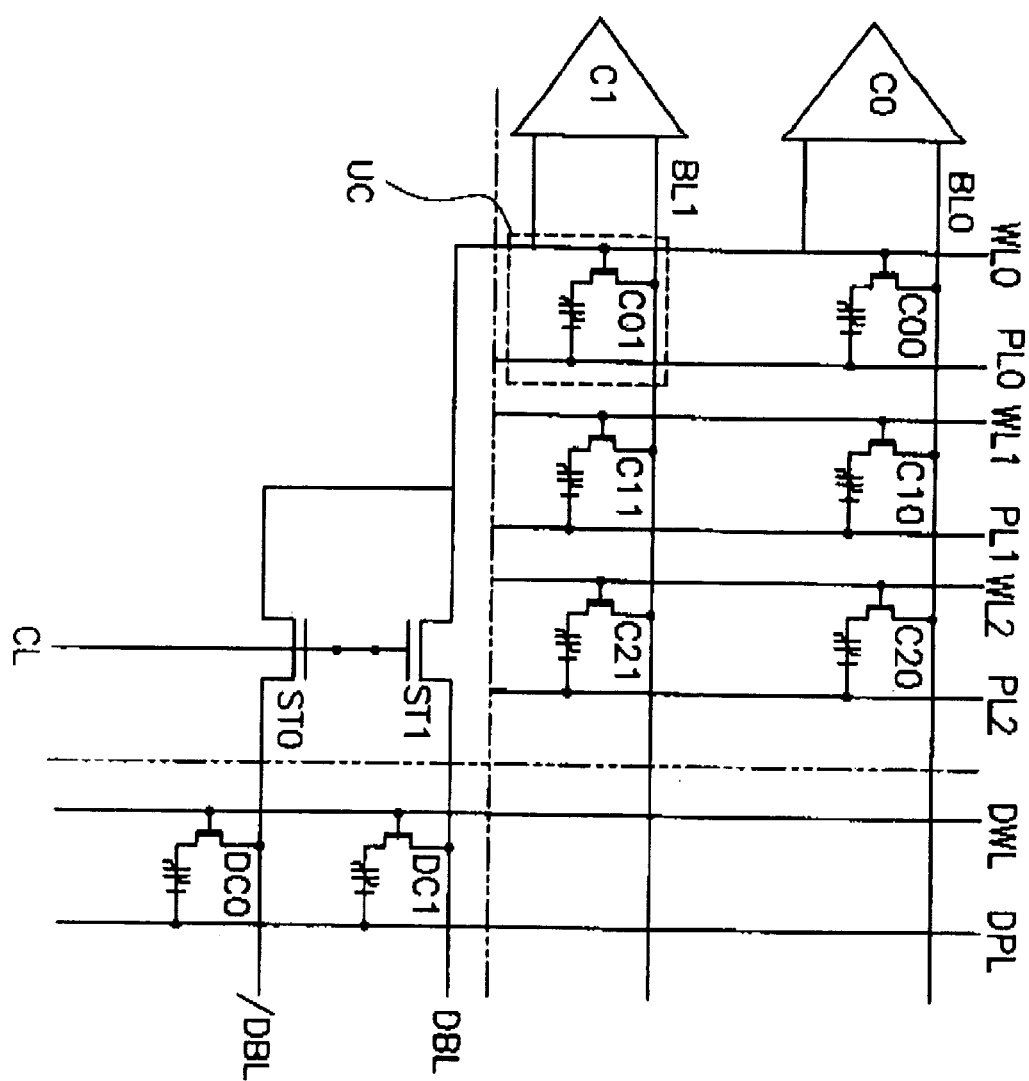
FIG. 5 is a circuit diagram illustrating the equivalent circuit of a Conventional FeRAM having a 1T/1C structure.
Figure 6:
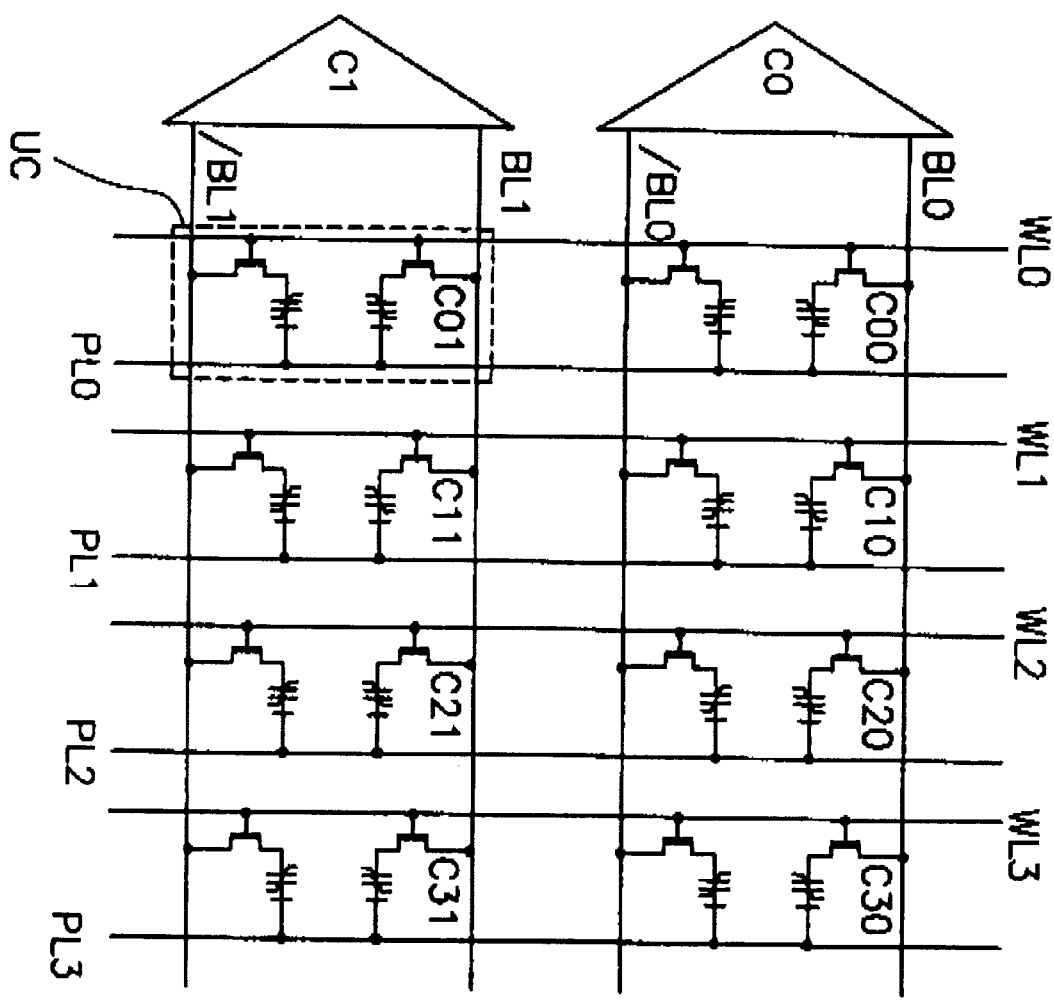
FIG. 6 is a circuit diagram illustrating the equivalent circuit of Another conventional FeRAM having a 2T/2C structure.

FIG. 4b is an equivalent circuit diagram illustrating a part of an FeRAM according to a second modified embodiment from the second embodiment of the present invention.

Referring to FIG. 4b, this second modified embodiment has the same configuration and arrangement as those of the above mentioned embodiments, except that the unit cells connected in series on each of the bit lines BL0, /BL0, BL1, and /BL1 are arranged in pair.

In the FeRAM according to the first modified embodiment, the procedures for inputting data "1" or "0" to an optional unit cell, and reading out data stored in the optional unit cell are the same as those in the second embodiment. Accordingly, no further description will be made in conjunction with those procedures, in order to avoid an unnecessarily repeated description.

Although the FeRAM according to the first modified embodiment has slightly different configurations from those of the second embodiment in that the unit cells connected in series on each of the bit lines are arranged in pair, the same effect as that of the third embodiment can be obtained.

As apparent from the above description, in the FeRAM according to this embodiment, which consists of M×N unit cells, each unit cell has a 1T/1C structure consisting of one transistor and one capacitor. In order to generate a reference voltage for a determination of data read out on a bit line in this FeRAM, dummy cells are used, which are respectively connected to bit lines neighboring to that bit line while having a potential inverse to the potential of the bit line. In is accordance with this configuration, data read out from an optional unit cell is determined by comparing a voltage outputted from a bit line, on which the data from that unit cell is read out, with a reference voltage outputted from bit lines neighboring to that bit line while having a potential inverse to the potential of the bit line. Accordingly, it is possible to greatly enhance the reliability in the determination of data read out from the unit cells of the memory while achieving a high integration of the memory.

Since a single plate electrode is connected in common to memory cells, using a common plate electrode line in place of plate electrode lines separated from one another in a row or column direction, it is possible to achieve an increase in capacitance within a given area.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A ferroelectric random access memory comprising a plurality of bit lines extending in one direction, a plurality of plate electrode lines extending in another direction perpendicular to the one direction, a plurality of word lines extending in the same direction as the plate electrode lines, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

further comprising:

a dummy cell group consisting of a plurality of dummy cells each connected to an associated one of the bit lines at an optional position on the associated bit line, each of the dummy cells consisting of one transistor and one capacitor; and a switching transistor group consisting of a plurality of switching transistors each serving to switch a connection between associated ones of the unit cells on an associated one of the bit lines, and to switch an input-to-input/output-to-output coupling between two associated ones of the dummy cells, in response to a control signal externally applied thereto;

whereby when data is read out from an optional one of the unit cells one a selected on of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

2. The ferroelectric random access memory according to claim 1, wherein the dummy cell groups and the switching transistor groups are arranged at optional positions within a selected one of the unit cell groups, respectively, in such a fashion that they separate each of the bit lines into two portions, the separated bit line portions being connected by an interconnection line.

3. The ferroelectric random access memory according to claim 2, wherein each of the bit line groups consists of two bit line pairs each including two bit lines, and dummy data required for a determination of the reference voltage is stored in at least two of dummy cells respectively connected to four bit lines of a selected one of the bit line groups when data is stored in an optional one of the unit cells on the selected bit line group.

4. The ferroelectric random access memory according to claim 3, wherein the dummy data in one of the at least two dummy cells is different from the dummy data in another one of the at least two dummy cells.

5. The ferroelectric random access memory according to claim 3, wherein when data is read out from an optional one of the unit cells on a selected one of the four bit lines, an average voltage between dummy data respectively outputted from two of dummy cells connected to three of the four bit lines other than the selected bit line is outputted as a reference voltage associated with a voltage corresponding to the read-out data.

6. The ferroelectric random access memory according to claim 4, wherein two of the four dummy cells are connected in common to a dummy plate electrode, the remaining two dummy cells are connected in common to another dummy plate electrode, and the four dummy cells are connected in common to a dummy word line.

7. The ferroelectric random access memory according to claim 4, wherein two of the four dummy cells are connected in common to a dummy plate electrode and a dummy word line, and the remaining two dummy cells are connected in common to another dummy plate electrode another dummy word line.

8. The ferroelectric random access memory according to claim 6, wherein when data is stored in the optional one of the unit cells on the selected bit line, a high voltage and a low voltage are applied to the dummy plate electrode lines, respectively.

9. The ferroelectric random access memory according to claim 8, wherein when data is read out from the optional one of the unit cells on the selected bit line, the low voltage is applied to the dummy plate electrode lines, respectively.

10. The ferroelectric random access memory according to claim 2, wherein the switching transistor group comprises:

a first switching group consisting of a plurality of switching transistors respectively arranged on those of the bit lines corresponding to one of two interlaced bit line groups each consisting of interlaced bit lines, each of the switching transistors in the first switching group serving to switch a connection of the dummy cell, arranged on an associated one of the bit lines in the one interlaced bit line group, to the associated bit line, the switching transistors in the first switching group being connected in common to a first control line;

a second switching group consisting of a plurality of switching transistors respectively arranged on those of the bit lines corresponding to the other one of the interlaced bit line groups, each of the switching transistors in the second switching group serving to switch a connection of the dummy cell, arranged on an associated one of the bit lines in the other interlaced bit line group, to the associated bit line, the switching transistors in the second switching group being connected in common to a second control line;

a third switching group consisting a plurality of switching transistors each connected between switching transistors included in an associated one of switching transistor pairs grouped from the switching transistors in the first switching group, each of the switching transistors in the third switching group serving to couple, in an input-to-input/output-to-output fashion, the dummy cells respectively corresponding to the switching transistors in the associated switching transistor pair of the first switching group, the switching transistors in the third switching group being connected in common to a third control line; and a fourth switching group consisting a plurality of switching transistors each connected between switching transistors included in an associated one of switching transistor pairs grouped from the switching transistors in the second switching group, each of the switching transistors in the fourth switching group serving to couple, in an input-to-input/output-to-output fashion, the dummy cells respectively corresponding to the switching transistors in the associated switching transistor pair of the second switching group, the switching transistors in the fourth switching group being connected in common to a fourth control line.

11. The ferroelectric random access memory according to claim 9, wherein when data is stored in an optional one of the unit cells, the first and second switching groups are controlled to be switched to ON states thereof, respectively, and the third and fourth switching groups are controlled to be switched to OFF states thereof, respectively.

12. The ferroelectric random access memory according to claim 9, wherein when data is read out from an optional one of the unit cells, the first and second switching groups are controlled in such a fashion that one of the first and second switching groups is switched to an ON state thereof whereas the other one of the first and second switching groups is switched to an OFF state thereof, and the third and fourth switching groups are controlled in such a fashion that one of the third and fourth switching groups is switched to an ON state thereof whereas the other one of the third and fourth switching groups is switched to an OFF state thereof.

13. A ferroelectric random access memory comprising a plurality of bit lines extending in one direction, a plurality of word lines in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

further comprising:

a dummy cell group consisting of a plurality of dummy cells each connected to an associated one of the bit lines at an optional position on the associated bit line, each of the dummy cells consisting of one transistor and one capacitor;

a switching transistor group consisting of a plurality of switching transistors each serving to switch a connection between associated ones of the unit cells on an associated one of the bit lines, and to switch an input-to-input/output-to-output coupling between two associated ones of the dummy cells, in response to a control signal externally applied thereto;

a common plate electrode line, to which respective plate electrodes of the unit cells and respective plate electrodes of the dummy cells are connected in common, the common plate electrode line being applied with a predetermined voltage;

whereby when data is read out from an optional one of the unit cells on a selected one of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

14. The ferroelectric random access memory according to claim 13, wherein the dummy cell groups and the switching transistor groups are arranged at optional positions within a selected one of the unit cell groups, respectively, in such a fashion that they separate each of the bit lines into two portions, the separated bit line portions being connected by an interconnection line.

15. The ferroelectric random access memory according to claim 14, wherein each of the bit line groups consists of two bit line pairs each including two bit lines, and dummy data required for a determination of the reference voltage is stored in the dummy cells respectively connected to at least three of the four bit lines in a selected one of the bit line groups when data is stored in an optional one of the unit cells on the selected bit line group.

16. The ferroelectric random access memory according to claim 15, wherein at least two unit cells are arranged in pair on each of the bit lines in such a fashion that they are connected together in series, and the unit cell pairs are arranged in an alternating fashion between neighboring ones of the bit lines.

17. The ferroelectric random access memory according to claim 15, wherein when data is stored in one of the unit cells associated with an optional one of the bit lines, two of the dummy cells are stored with dummy data of the same value, respectively, and another one of the dummy cells connected to the other neighboring bit line is stored with dummy data having a value different from that of the dummy data stored in the two dummy cells.

18. The ferroelectric random access memory according to claim 15, wherein when data is read out from an optional one of the unit cells on a selected one of the four bit lines, an average voltage between dummy data respectively outputted from two of dummy cells connected to three of the four bit lines other than the selected bit line is outputted as a reference voltage associated with a voltage corresponding to the read-out data.

19. The ferroelectric random access memory according to claim 18, wherein the four dummy cells are connected in common to a dummy word line.

20. The ferroelectric random access memory according to claim 19, wherein two of the four dummy cells are connected in common to a dummy word line, and the remaining two dummy cells are connected in common to another dummy word line.

21. The ferroelectric random access memory according to claim 14, wherein the switching transistor group comprises:

a first switching group consisting of a plurality of switching transistors respectively arranged on those of the bit lines corresponding to one of two interlaced bit line groups each consisting of interlaced bit lines, each of the switching transistors in the first switching group serving to switch a connection of the dummy cell, arranged on an associated one of the bit lines in the one interlaced bit line group, to the associated bit line, the switching transistors in the first switching group being connected in common to a first control line;

a second switching group consisting of a plurality of switching transistors respectively arranged on those of the bit lines corresponding to the other one of the interlaced bit line groups, each of the switching transistors in the second switching group serving to switch a connection of the dummy cell, arranged on an associated one of the bit lines in the other interlaced bit line group, to the associated bit line, the switching transistors in the second switching group being connected in common to a second control line;

a third switching group consisting a plurality of switching transistors each connected between switching transistors included in an associated one of switching transistor pairs grouped from the switching transistors in the first switching group, each of the switching transistors in the third switching group serving to couple, in an input-to-input/output-to-output fashion, the dummy cells respectively corresponding to the switching transistors in the associated switching transistor pair of the first switching group, the switching transistors in the third switching group being connected in common to a third control line; and a fourth switching group consisting a plurality of switching transistors each connected between switching transistors included in an associated one of switching transistor pairs grouped from the switching transistors in the second switching group, each of the switching transistors in the fourth switching group serving to couple, in an input-to-input/output-to-output fashion, the dummy cells respectively corresponding to the switching transistors in the associated switching transistor pair of the second switching group, the switching transistors in the fourth switching group being connected in common to a fourth control line.

22. The ferroelectric random access memory according to claim 21, wherein when data is stored in an optional one of the unit cells, the first and second switching groups are controlled to be switched to ON states thereof, respectively, and the third and fourth switching groups are controlled to be switched to OFF states thereof, respectively.

23. The ferroelectric random access memory according to claim 21, wherein when data is read out from an optional one of the unit cells, the first and second switching groups are controlled in such a fashion that one of the first and second switching groups is switched to an ON state thereof whereas the other one of the first and second switching groups is switched to an OFF state thereof, and the third and fourth switching groups are controlled in such a fashion that one of the third and fourth switching groups is switched to an ON state thereof whereas the other one of the third and fourth switching groups is switched to an OFF state thereof.

24. A ferroelectric random access memory comprising a plurality of bit lines extending in one direction, a plurality of word lines in another direction perpendicular to the one direction, and a plurality of unit cells arranged in an M×N array while being connected to associated ones of the lines, each of the unit cells consisting of one transistor and one capacitor, wherein the unit cells are grouped into a plurality of unit cell groups, each of the unit cell groups consisting of a plurality of unit cells connected to associated ones of the bit lines, respectively, in such a fashion that they are arranged in an interlaced fashion in a row direction or in a column direction, those of the bit lines connected to each of the bit lines being connected together in series;

further comprising:

a dummy cell group consisting of a plurality of dummy cells each connected to an associated one of the bit lines at an optional position on the associated bit line, each of the dummy cells consisting of one transistor and one capacitor;

a switching transistor group consisting of a plurality of switching transistors each serving to switch an input-to-input/output-to-output coupling between respective dummy cells connected to two of the bit lines neighboring to each other in an interlaced fashion, the switching transistor applying an output thereof to a selected one of the two neighboring bit lines in response to a control signal externally applied thereto;

a common plate electrode line, to which respective plate electrodes of the unit cells and respective plate electrodes of the dummy cells are connected in common, the common plate electrode line being applied with a predetermined voltage;

whereby when data is read out from an optional one of the unit cells on a selected one of the bit lines, an average voltage between voltages respectively outputted from those of the dummy cells connected to two bit lines neighboring to the selected bit line is applied to the neighboring bit lines as a reference voltage required for a comparison with a voltage corresponding to the read-out data.

25. The ferroelectric random access memory according to claim 24, wherein at least two unit cells are arranged in pair on each of the bit lines in such a fashion that they are connected together in series, and the unit cell pairs are arranged in an alternating fashion between neighboring ones of the bit lines.

26. The ferroelectric random access memory according to claim 25, wherein each of the bit line groups consists of two bit line pairs each including two bit lines, and dummy data required for a determination of the reference voltage is stored in the dummy cells respectively connected to at least two of the four bit lines in a selected one of the bit line groups when data is stored in an optional one of the unit cells on the selected bit line group.

27. The ferroelectric random access memory according to claim 26, wherein the dummy data in one of the at least two dummy cells is different from the dummy data in another one of the at least two dummy cells.

28. The ferroelectric random access memory according to claim 26, wherein two of the four dummy cells are connected in common to a dummy word line, and the remaining two dummy cells are connected in common to another dummy word line.

29. The ferroelectric random access memory according to claim 25, wherein the switching transistor group comprises:

a first switching group consisting of a plurality of switching transistors respectively arranged on those of the bit lines corresponding to one of two interlaced bit line groups each consisting of interlaced bit lines, each of the switching transistors in the first switching group serving to switch an input-to-input/output-to-output coupling of the dummy cell, arranged on an associated one of the bit lines in the one interlaced bit line group, to the associated bit line, the switching transistors in the first switching group being connected in common to a first control line; and a second switching group consisting of a plurality of switching transistors respectively arranged on those of the bit lines corresponding to the other one of the interlaced bit line groups, each of the switching transistors in the second switching group serving to switch an input-to-input/output-to-output coupling of the dummy cell, arranged on an associated one of the bit lines in the other interlaced bit line group, to the associated bit line, the switching transistors in the second switching group being connected in common to a second control line.

30. The ferroelectric random access memory according to claim 29, wherein when data is read out from an optional one of the unit cells, the switching transistors of the first and second switching groups are controlled in opposite fashions, respectively.

31. The ferroelectric random access memory according to claim 30, wherein the switching transistor connected to a selected one of the bit lines in association with the read-out of the data is controlled to be switched to an OFF state thereof, and the switching transistor connected to the bit line neighboring to the selected bit line is controlled to be switched to an ON state thereof.

* * * * *